(12) United States Patent
Jung et al.

(10) Patent No.: US 12,710,838 B2
(45) Date of Patent: Aug. 18, 2026

(54) DISPLAY DEVICE

(71) Applicant: LG Display Co., Ltd., Seoul (KR)

(72) Inventors: Jin-Hyun Jung, Paju-si (KR); Jaeik Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/936,227

(22) Filed: Nov. 4, 2024

(65) Prior Publication Data

US 2025/0231634 A1 Jul. 17, 2025

(30) Foreign Application Priority Data

Jan. 16, 2024 (KR) ........................ 10-2024-0006536

(51) Int. Cl.

*G09G 3/3258* (2016.01)
*G06F 3/041* (2006.01)
*G06F 3/044* (2006.01)
*G09G 3/3225* (2016.01)
*G09G 3/3233* (2016.01)
(Continued)

(52) U.S. Cl.

CPC ......... *G06F 3/0412* (2013.01); *G09G 3/3225* (2013.01); *G09G 3/3258* (2013.01); *H10K 59/131* (2023.02); *H10K 59/40* (2023.02); *G06F 3/04166* (2019.05); *G06F 3/041662* (2019.05); *G06F 3/04184* (2019.05); *G06F 3/0446* (2019.05); *G06F 2203/04106* (2013.01); *G09G 3/3233* (2013.01); *G09G 2300/0819* (2013.01); *G09G 2300/0852* (2013.01); *G09G 2300/0861* (2013.01); *G09G 2310/06* (2013.01); *G09G 2310/08* (2013.01); *G09G 2354/00* (2013.01)

(58) Field of Classification Search

CPC .. G06F 3/0412; G06F 3/0416; G06F 3/04164; G06F 3/04166; G06F 3/041662; G06F 3/04184; G06F 3/044; G06F 3/0446; G06F 2203/04106; G09G 3/3225; G09G 3/3233; G09G 3/3258; G09G 3/36; G09G 2300/0819; G09G 2300/0852; G09G 3/3648; G09G 2300/0861; H10K 59/131; H10K 59/40

See application file for complete search history.

(56) References Cited

U.S. PATENT DOCUMENTS

2018/0004323 A1* 1/2018 Yang .................... G09G 3/3225
2024/0160318 A1* 5/2024 Lee ....................... G06F 3/0412
2025/0231634 A1* 7/2025 Jung .................... H10K 59/131

FOREIGN PATENT DOCUMENTS

EP 3637402 A2 * 4/2020 ........... G09G 3/3291

* cited by examiner

*Primary Examiner* — Julie Anne Watko
(74) *Attorney, Agent, or Firm* — Seed Intellectual Property Law Group LLP

(57) ABSTRACT

The present disclosure provides a display device according to embodiments of the present disclosure may include including a driving transistor for driving the light emitting device, a scan transistor electrically connected to a gate node of the driving transistor, and a first control transistor electrically connected between the scan transistor and a data line, the first control transistor being turned off during a floating period of a touch driving period by a driving control signal applied to a gate node thereof and electrically disconnecting between the scan transistor and the data line, thereby improving a touch sensitivity eliminating an influence of the data line on a touch signal supply line.

17 Claims, 22 Drawing Sheets

(51) Int. Cl.
*H10K 59/131* (2023.01)
*H10K 59/40* (2023.01)

DISPLAY DEVICE

CROSS REFERENCE TO RELATED APPLICATION

This application claims priority from Korean Patent Application No. 10-2024-0006536, filed on Jan. 16, 2024, which is hereby incorporated by reference for all purposes as if fully set forth herein.

BACKGROUND

Technical Field

Embodiments of the present disclosure relate to a display device.

Description of the Related Art

As the information society develops, the demand for display devices for displaying images is increasing in various forms, and in recent years, various display devices such as liquid crystal displays and organic light emitting display devices have been used.

A display device may be capable of both image display driving and touch driving.

If both the image display driving and touch driving are possible, a line or wiring related to image display driving may affect a line or wiring related to touch driving.

BRIEF SUMMARY

Embodiments of the present disclosure may provide a display device capable of reliably controlling subpixels during touch driving period.

Embodiments of the present disclosure may provide a display device in which subpixels do not affect touch driving during the touch driving period.

Embodiments of the present disclosure may provide a display device capable of improving the touch sensitivity.

Embodiments of the present disclosure may provide a display device capable of lower power consumption with improved touch sensitivity.

A display device according to embodiments of the present disclosure may include a pixel area where a subpixel is disposed, and a touch area where a touch unit is disposed. The subpixel may include a light emitting device, a driving transistor for driving the light emitting device, a scan transistor electrically connected to a gate node of the driving transistor, and a first control transistor electrically connected between the scan transistor and a data line.

The subpixel may further include a sensing transistor electrically connected to the driving transistor, and a second control transistor electrically connected between the sensing transistor and a reference voltage line.

A period during which the subpixel is driven may include an image display driving period for controlling the light emitting device, and a touch driving period for controlling the touch unit.

The touch driving period may include an initialization voltage supply period and a floating period.

The initialization voltage supply period may be a period during which a line initialization voltage is supplied to the data line.

The floating period may be a period during which the first transistor is maintained in a turn-off state.

According to embodiments of the present disclosure, it is possible to provide a display device capable of reliably controlling subpixels during touch driving period.

According to embodiments of the present disclosure, it is possible to provide a display device in which subpixels do not affect touch driving during the touch driving period.

According to embodiments of the present disclosure, it is possible to provide a display device capable of improving the touch sensitivity.

According to embodiments of the present disclosure, it is possible to provide a display device capable of lower power consumption with improved touch sensitivity.

DETAILED DESCRIPTION

Figure 1:
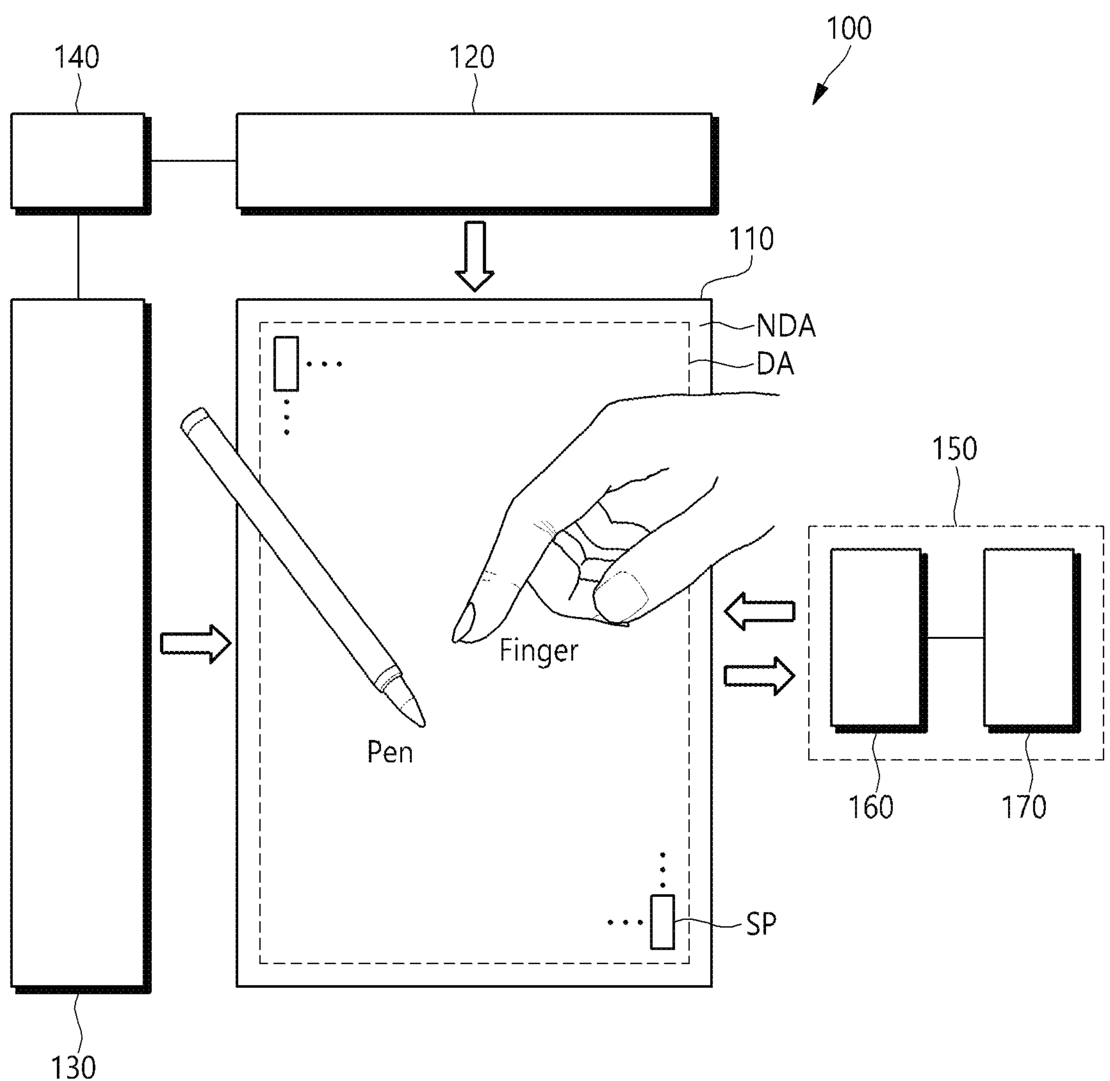
FIG. 1 is a system configuration diagram of a display device according to embodiments of the present disclosure.

Hereinafter, embodiments of the disclosure are described in detail with reference to the accompanying drawings. In assigning reference numerals to components of each drawing, the same components may be assigned the same numerals even when they are shown on different drawings. When determined to make the subject matter of the disclosure unclear, the detailed of the known art or functions may be skipped. As used herein, when a component "includes," "has," or "is composed of" another component, the component may add other components unless the component "only" includes, has, or is composed of" the other component. As used herein, the singular forms "a", "an" and "the" are intended to include the plural forms as well, unless the context clearly indicates otherwise.

Such denotations as "first," "second," "A," "B," "(a)," and "(b)," may be used in describing the components of the disclosure. These denotations are provided merely to distinguish a component from another, and the essence, order, or number of the components are not limited by the denotations.

In describing the positional relationship between components, when two or more components are described as "connected", "coupled" or "linked", the two or more components may be directly "connected", "coupled" or "linked" ", or another component may intervene. Here, the other component may be included in one or more of the two or more components that are "connected", "coupled" or "linked" to each other.

When such terms as, e.g., "after", "next to", "after", and "before", are used to describe the temporal flow relationship related to components, operation methods, and fabricating methods, it may include a non-continuous relationship unless the term "immediately" or "directly" is used.

When a component is designated with a value or its corresponding information (e.g., level), the value or the corresponding information may be interpreted as including a tolerance that may arise due to various factors (e.g., process factors, internal or external impacts, or noise).

Hereinafter, various embodiments of the disclosure are described in detail with reference to the accompanying drawings.

FIG. 1 is a system configuration diagram of a display device 100 according to embodiments of the present disclosure.

Referring to FIG. 1, a display device 100 according to embodiments of the present disclosure may include a display panel 110 and a display driving circuit as components for displaying an image.

The display driving circuit is a circuit for driving the display panel 110, and may include a data driving circuit 120, a gate driving circuit 130, and a display controller 140.

The display panel 110 may include a display area DA where an image is displayed and a non-display area NDA where an image is not displayed. The non-display area NDA may be an area outside the display area DA, and may also be referred to as a bezel area.

The display panel 110 may include a plurality of subpixels SP. In addition, the display panel 110 may further include various types of signal lines to drive a plurality of subpixels SP.

Various types of signal lines may include a plurality of data lines supplying data signals (also called data voltages or image signals) and a plurality of gate lines for transmitting gate signals (also called scan signals). The plurality of data lines and the plurality of gate lines may cross each other. Each of the plurality of data lines may be arranged to extend in a first direction. Each of the plurality of gate lines may be arranged to extend in a second direction. Here, the first direction may be a column direction and the second direction may be a row direction. Alternatively, the first direction may be a row direction and the second direction may be a column direction.

The display device 100 according to embodiments of the present disclosure may be a liquid crystal display device, or may be a self-luminous display device in which the display panel 110 emits light on its own. If the display device 100 according to embodiments of the present disclosure is a self-luminous display device, each of the plurality of subpixels SP may include a light emitting device.

For example, the display device 100 according to embodiments of the present disclosure may be an organic light emitting display device in which a light emitting device is implemented as an organic light emitting diode (OLED). For another example, the display device 100 according to embodiments of the present disclosure may be an inorganic light emitting display device in which the light emitting device is implemented as an inorganic-based light emitting diode. For another example, the display device 100 according to embodiments of the present disclosure may be a quantum dot display device in which a light emitting device is implemented with quantum dots, which are semiconductor crystals emitting light by itself.

The structure of each of the plurality of subpixels SP may vary depending on the type of the display device 100. For example, if the display device 100 is a self-luminous display device with the subpixel SP emitting light by itself, each subpixel SP may include a self-luminous light emitting device, one or more transistors, and one or more capacitors.

The data driving circuit 120 is a circuit for driving a plurality of data lines, and may output data signals to the plurality of data lines. The gate driving circuit 130 is a circuit for driving a plurality of gate lines, and may output gate signals to the plurality of gate lines. The display controller 140 may be a device for controlling the data driving circuit 120 and the gate driving circuit 130, and may control the driving timing for the plurality of data lines DL and the driving timing of the plurality of gate lines GL.

The display controller 140 may supply a data driving control signal to the data driving circuit 120 to control the data driving circuit 120, and may supply a gate driving control signal to the gate driving circuit 130 to control the gate driving circuit 130.

The data driving circuit 120 may supply data signals to a plurality of data lines according to the driving timing control of the display controller 140. The data driving circuit 120 may receive digital image data from the display controller 140, convert the received image data into analog data signals, and output the converted image data through a plurality of data lines.

The gate driving circuit 130 may supply gate signals to a plurality of gate lines GL according to timing control of the display controller 140. The gate driving circuit 130 may receive a first gate voltage corresponding to a turn-on level voltage and a second gate voltage corresponding to a turn-off level voltage along with various gate driving control signals (e.g., start signal, reset signal, etc.), may generate gate signals and supply the generated gate signals to the plurality of gate lines.

The data driving circuit 120 may be connected to the display panel 110 using a tape automated bonding (TAB) method, or may be connected to the bonding pad of the display panel 110 using a chip-on-glass (COG) or chip-on-panel (COP) method, or may be implemented using a chip-on-film (COF) method and connected to the display panel 110.

The gate driving circuit 130 may be connected to the display panel 110 using a tape automated bonding (TAB) method, or may be connected to the bonding pad of the display panel 110 using a chip-on-glass (COG) or chip-on-panel (COP) method, or may be connected to the display panel 110 using a chip-on-film (COF) method. Alternatively, the gate driving circuit 130 may be a gate-in-panel (GIP) type, and may be formed in the non-display area NDA of the display panel 110. The gate driving circuit 130 may be disposed on or connected to the substrate. That is, if the gate driving circuit 130 is a gate-in-panel (GIP) type, it may be disposed in the non-display area NDA of the substrate. The gate driving circuit 130 may be connected to the substrate if it is a chip-on-glass (COG) type, chip-on-film (COF) type, etc.

Meanwhile, at least one of the data driving circuit 120 and the gate driving circuit 130 may be disposed in the display area DA of the display panel 110. For example, at least one of the data driving circuit 120 and the gate driving circuit 130 may be disposed not to overlap the subpixels SP, and may be disposed to partially or entirely overlap the subpixels SP.

The data driving circuit 120 may be connected to one side (e.g., the upper or lower side) of the display panel 110. Depending on the driving method or panel design method, the data driving circuit 120 may be connected to both sides (e.g., upper and lower sides) of the display panel 110, or may be connected to two or more of the four sides of the display panel 110.

The gate driving circuit 130 may be connected to one side (e.g., left or right) of the display panel 110. Depending on the driving method or panel design method, the gate driving circuit 130 may be connected to both sides (e.g., left and right) of the display panel 110, or may be connected to two or more of the four sides of the display panel 110.

The display controller 140 may be implemented as a separate component from the data driving circuit 120, or may be integrated with the data driving circuit 120 and implemented as an integrated circuit.

The display controller 140 may be a timing controller used in typical display technology, or may be a control device capable of further performing other control functions including a timing controller, or may be a control device different from the timing controller, or may be a control device other than a timing controller, or may be a circuit within the control device. The display controller 140 may be implemented with various circuits or electronic components, such as an integrated circuit (IC), a field programmable gate array (FPGA), an application specific integrated circuit (ASIC), or Processor.

The display controller 140 may be mounted on a printed circuit board, a flexible printed circuit, etc., and may be electrically connected to the data driving circuit 120 and the gate driving circuit 130 through a printed circuit board, a flexible printed circuit.

The display controller 140 may transmit and receive signals with the data driving circuit 120 according to one or more predetermined interfaces. For example, the interface may include a low voltage differential signaling (LVDS) interface, an embedded clock point-point interface (EPI) interface, or a serial peripheral interface (SPI).

In order to provide not only an image display function but also a touch sensing function, the display device 100 according to embodiments of the present disclosure may include a touch sensor and a touch sensing circuit 150 for detecting an occurrence of a touch by a touch object such as a finger or pen or detection a touch position by sensing the touch sensor.

The touch sensing circuit 150 may include a touch driving circuit 160 for driving and sensing a touch sensor to generate and output touch sensing data, and a touch controller 170 for detecting the occurrence of a touch or detecting the touch position using touch sensing data.

A touch sensor may include a plurality of touch electrodes. The touch sensor may further include a plurality of touch lines to electrically connect a plurality of touch electrodes and the touch driving circuit 160.

In the case of the display device 100 according to embodiments of the present disclosure, touch, the touch sensor may exist outside the display panel 110 in the form of a touch panel or may exist inside the display panel 110. In this case, the touch sensor may be referred to as a built-in touch sensor, an embedded touch sensor or in-cell touch sensor. During the manufacturing process of the display panel 110, an embedded touch sensor may be formed along with electrodes or signal lines related to display driving.

The touch driving circuit 150 may supply a touch driving signal to at least one of the plurality of touch electrodes, and generate touch sensing data by sensing at least one of the plurality of touch electrodes.

The touch sensing circuit 150 may perform touch sensing using a self-capacitance sensing method or a mutual-capacitance sensing method.

If the touch sensing circuit 150 performs touch sensing using a self-capacitance sensing method, the touch sensing circuit may perform touch sensing based on the capacitance between each touch electrode and a touch object (e.g., finger, pen, etc.). According to the self-capacitance sensing method, each of the plurality of touch electrodes may serve as a driving touch electrode and a sensing touch electrode. The touch driving circuit 160 may drive all or part of the plurality of touch electrodes and sense all or part of the plurality of touch electrodes.

If the touch sensing circuit 150 performs touch sensing using the mutual-capacitance sensing method, the touch sensing circuit 150 may perform touch sensing based on the capacitance between touch electrodes. According to the mutual-capacitance sensing method, the plurality of touch electrodes may be divided into driving touch electrodes and sensing touch electrodes. The touch driving circuit 160 may drive touch electrodes and sense sensing touch electrodes.

As described above, the touch sensing circuit 150 may perform touch sensing using a self-capacitance sensing method and/or a mutual-capacitance sensing method. However, hereinafter, for convenience of explanation, it is assumed that the touch sensing circuit 150 performs touch sensing using a self-capacitance sensing method.

Each of the touch driving circuit 160 and the touch controller 170 may be implemented as separate integrated circuits. Alternatively, the touch driving circuit 160 and the touch controller 170 may be integrated and implemented.

Each of the touch driving circuit 160 and the touch controller 170 may be implemented as separate integrated circuits. Alternatively, the touch driving circuit 160 and the touch controller 170 may be integrated and implemented. For example, if the display device 100 includes one driving integrated circuit chip, one driving integrated circuit chip may include a touch driving circuit 160 and a data driving circuit 120. For another example, if the display device 100 includes a plurality of driving integrated circuit chips, each of the plurality of driving integrated circuit chips may include a portion of the touch driving circuit 160 and a portion of the data driving circuit 120.

The display device 100 may further include a power supply circuit which supplies various types of power to the display driving circuit and/or the touch sensing circuit.

The display device 100 according to embodiments of the present disclosure may be a mobile terminal such as a smart phone or tablet, or a monitor or television of various sizes, but is not limited thereto, and may be a display of various types and sizes capable of displaying information or images.

Figures 2A, 2B:
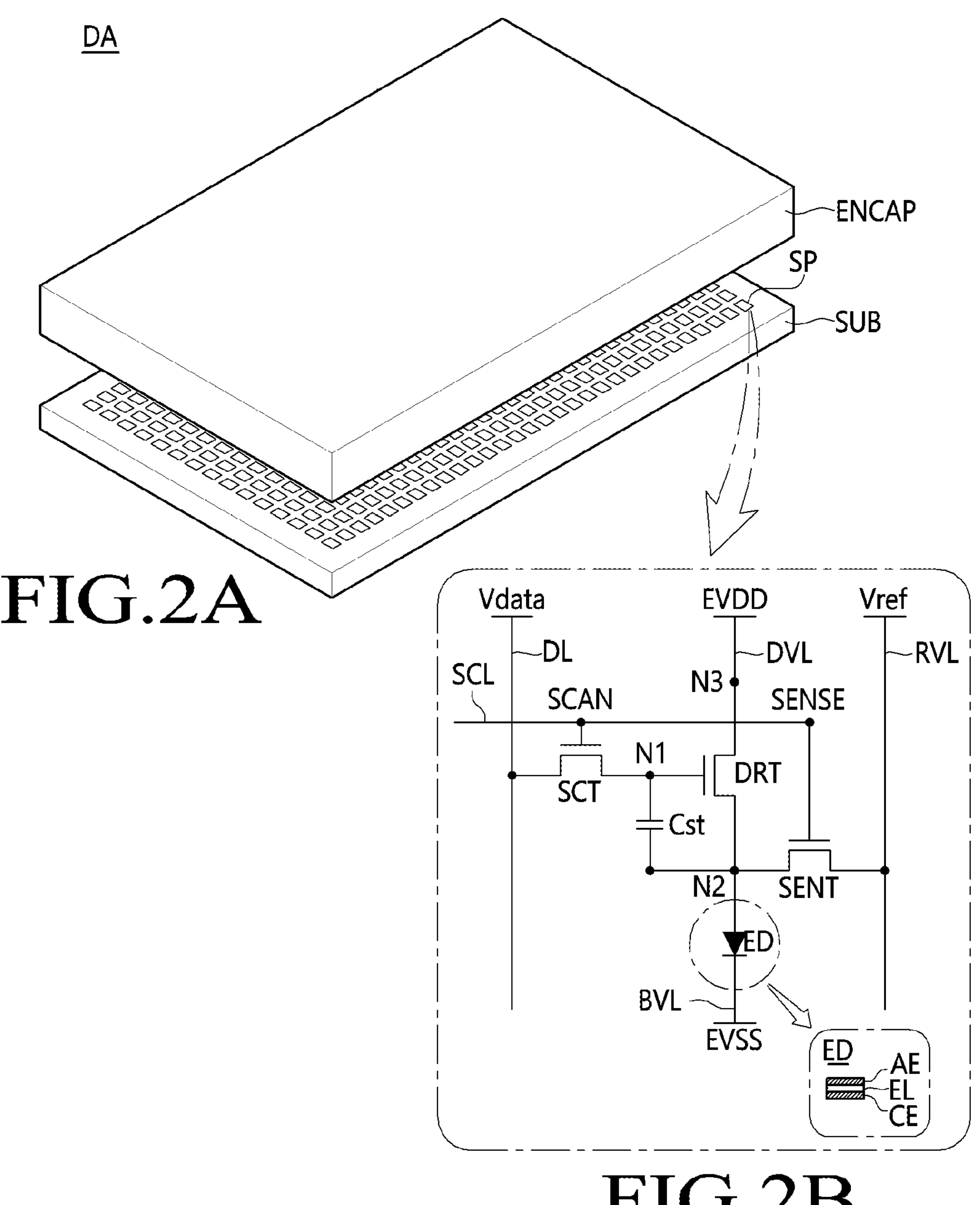
FIG. 2 illustrates a schematic structure of a display panel of a display device according to embodiments of the present disclosure.

FIGS. 2A and 2B illustrates a schematic structure of a display panel of a display device 100 according to embodiments of the present disclosure.

Referring to FIGS. 2A and 2B, each of the plurality of subpixels SP disposed in the display area DA of a display panel 110 of the display device 100 may include a light emitting device ED, a driving transistor DRT for driving a light emitting device ED, a scan transistor SCT for transferring a data voltage Vdata to a first node N1 of the driving transistor DRT, and a storage capacitor Cst to maintain a constant voltage during one frame.

The driving transistor DRT may include a first node N1 to which a data voltage can be applied, a second node N2 electrically connected to the light emitting device ED, and a third node N3 supplied with a driving voltage EVDD from a driving voltage line DVL. In the driving transistor DRT, the first node N1 may be a gate node, the second node N2 may be a source node or a drain node, and the third node N3 may be a drain node or a source node. Hereinafter, for convenience of explanation, the first node N1 of the driving transistor DRT is also referred to as a gate node or gate electrode, the second node N2 of the driving transistor DRT is also referred to as a source node or source electrode, and the third node N3 of the driving transistor DRT is also referred to as a drain node or drain electrode.

The light emitting device ED may include an anode electrode AE, a light emitting layer or an emission layer EL, and a cathode electrode CE. The anode electrode AE of the light emitting device ED may be electrically connected to the second node N2 of the driving transistor DRT of each subpixel SP. The cathode electrode CE of the light emitting device ED may be electrically connected to a base voltage line BVL to which a base voltage EVSS is applied.

The anode electrode AE may be a pixel electrode disposed in each subpixel SP. The cathode electrode CE may be a common electrode to which a base voltage EVSS, which is a type of common voltage commonly required when driving the subpixels SP, is applied.

For example, the light emitting device ED may be an organic light emitting diode (OLED), an inorganic light emitting diode, or a quantum dot light emitting device. In the case that the light emitting device ED is an organic light emitting diode (OLED), the emission layer EL of the light emitting device ED may include an organic emission layer containing an organic material.

The scan transistor SCT may be controlled on-off by a scan signal SCAN, which is a gate signal applied through a scan signal line SCL, and may be electrically connected between the first node N1 of the driving transistor DRT and the data lines DL.

The storage capacitor Cst may be connected between the first node N1 and the second node N2 of the driving transistor DRT.

Referring to FIGS. 2A and 2B, each of the plurality of subpixels SP disposed in the display area DA of the display panel 110 of the display device 100 may basically include a light emitting device ED, two transistors DRT and SCT, and one capacitor Cst.

Each of the plurality of subpixels SP disposed in the display area DA of the display panel 110 of the display device 100 may further include one or more transistors or one or more capacitors.

For example, as shown in FIGS. 2A and 2B, each subpixel SP may further include a sensing transistor SENT for controlling the connection between the second node N2 of the driving transistor DRT and a reference voltage line RVL. Here, the reference voltage line RVL is a signal line for supplying a reference voltage Vref to the subpixel SP.

As shown in FIGS. 2A and 2B, a gate node of the sensing transistor SENT may be electrically connected to a gate node of the scan transistor SCT. That is, the scan signal line SCL electrically connected to the gate node of the scan transistor SCT may also be electrically connected to the gate node of the sensing transistor SENT.

Alternatively, the gate node of the sensing transistor SENT may be electrically connected to a sensing signal line other than the scan signal line SCL connected to the gate node of the scan transistor SCT.

The storage capacitor Cst may be an external capacitor intentionally designed outside the driving transistor DT rather than a parasitic capacitor (e.g., Cgs, Cgd) as an internal capacitor which may exist between the first node N1 and the second node N2 of the driving transistor DRT.

Each of the driving transistor DRT, the scan transistor SCT, and the sensing transistor SENT may be an n-type transistor or a p-type transistor.

Since the circuit elements (in particular, the light emitting device ED) within each subpixel SP are vulnerable to external moisture or oxygen, the display panel 110 may include an encapsulation layer ENCAP to prevent external moisture or oxygen from penetrating into the circuit elements (particularly, the light emitting device ED).

The encapsulation layer ENCAP may be composed of various types.

For example, the encapsulation layer ENCAP may be disposed to cover the light emitting device ED. The encapsulation layer ENCAP may include one or more inorganic films and one or more organic films.

For another example, the encapsulation layer ENCAP may include an encapsulation substrate, a dam located between a thin film transistor array substrate and the encapsulation substrate along the outer edge of the display area DA, and a filler which fills the internal space of the dam.

Figure 3:
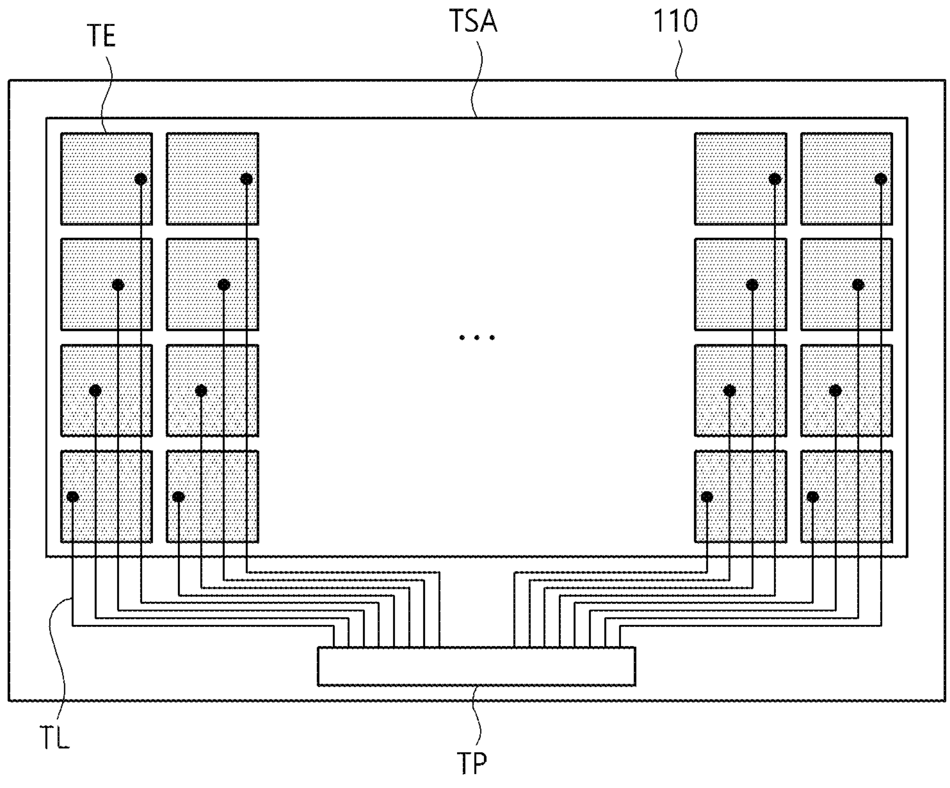
FIG. 3 briefly illustrates a touch sensor structure of a display device according to embodiments of the present disclosure.

FIG. 3 briefly illustrates a touch sensor structure of a display device 100 according to embodiments of the present disclosure.

Referring to FIG. 3, the display device 100 according to embodiments of the present disclosure may include a touch sensor disposed in a touch sensing area TSA of the display panel 110.

The touch sensor included in the display device 100 according to embodiments of the present disclosure may include a plurality of touch electrodes TE disposed in the touch sensing area TSA.

The touch sensor included in the display device 100 according to embodiments of the present disclosure may further include a plurality of touch lines TL for electrically connecting the plurality of touch electrodes TE with a plurality of touch pads TP to which the touch driving circuit 160 is electrically connected. Here, the plurality of touch lines TL may be also referred to as a plurality of touch routing lines.

If the touch sensor included in the display device 100 according to embodiments of the present disclosure is a self-capacitance sensing type, each of the plurality of touch electrodes TE may not electrically overlap or intersect each other. In a touch sensor structure of self-capacitance type, each of the plurality of touch electrodes TE may be one touch node corresponding to a touch coordinate.

If the display device 100 according to embodiments of the present disclosure senses a touch based on self-capacitance, the touch driving circuit 160 may supply a touch driving signal to at least one touch electrode TE among the plurality of touch electrodes TE, and may sense the touch electrode TE supplied with the touch driving signal.

Each of the plurality of touch electrodes TE may be an electrode without an opening or may be a mesh-type electrode with a plurality of openings. In addition, each of the plurality of touch electrodes TE may be a transparent electrode.

The sensing value for the touch electrode TE supplied with the touch driving signal may be a value corresponding to the capacitance or a change thereof in the touch electrode TE supplied with the touch driving signal. The capacitance at the touch electrode TE supplied with the touch driving signal may be the capacitance between the touch electrode TE supplied with the touch driving signal and a touch pointer, such as a finger.

As described above, in the display device 100 according to embodiments of the present disclosure, a touch sensor including a plurality of touch electrodes TE may be built into the display panel 110. Accordingly, during the manufacturing process of the display panel 110, the touch electrodes TE and touch lines TL may also be formed when forming the electrodes, lines, and patterns related to display driving.

Meanwhile, the touch electrode may be arranged to be horizontally spaced apart from the subpixel. In this case, if the touch electrode is a transparent electrode, there may be implemented a transparent display device. It will be explained the driving method for the touch electrode and subpixel after explaining the arrangement structure of the touch electrode and subpixel.

Figure 4:
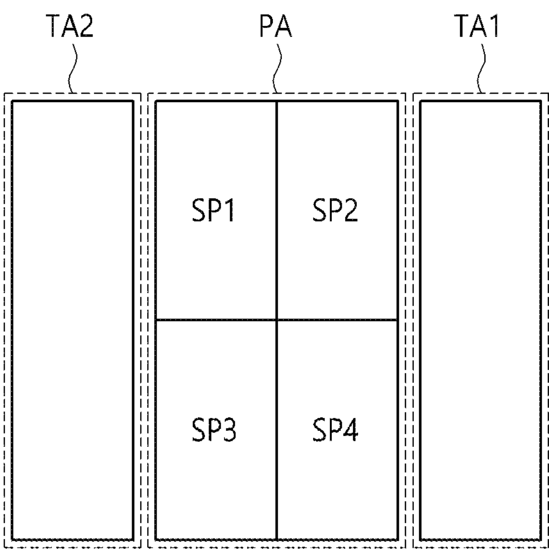
FIG. 4 illustrates a pixel area and a transmission area in a portion of a display panel of a display device according to embodiments of the present disclosure.

FIG. 4 illustrates a pixel area PA and a transmission area TA1 and TA2 in a portion of a display panel 110 of a display device 100 according to embodiments of the present disclosure.

Referring to FIG. 4, a portion of the display panel 110 of the display device 100 according to embodiments of the present disclosure may include a pixel area PA, a first transmission area TA1, and a second transmission area TA2. The pixel area PA may be an area where subpixels are disposed. The component for touch may be disposed in the transmission areas TA1 and TA2.

Referring to FIG. 4, the first transmission area TA1 may be located on a first side of the pixel area PA, and the second transmission area TA2 may be located on a second side of the pixel area PA.

Referring to FIG. 4, one or more subpixels SP1, SP2, SP3, and SP4 may be disposed in the pixel area PA between the first transmission area TA1 and the second transmission area TA2.

According to the example of FIG. 4, four subpixels SP1, SP2, SP3 and SP4 may be disposed in the pixel area PA between the first transmission area TA1 and the second transmission area TA2. The four subpixels SP1, SP2, SP3 and SP4 may include a subpixel emitting red light, a subpixel emitting green light, a subpixel emitting blue light, and a subpixel emitting white light.

Figure 5:
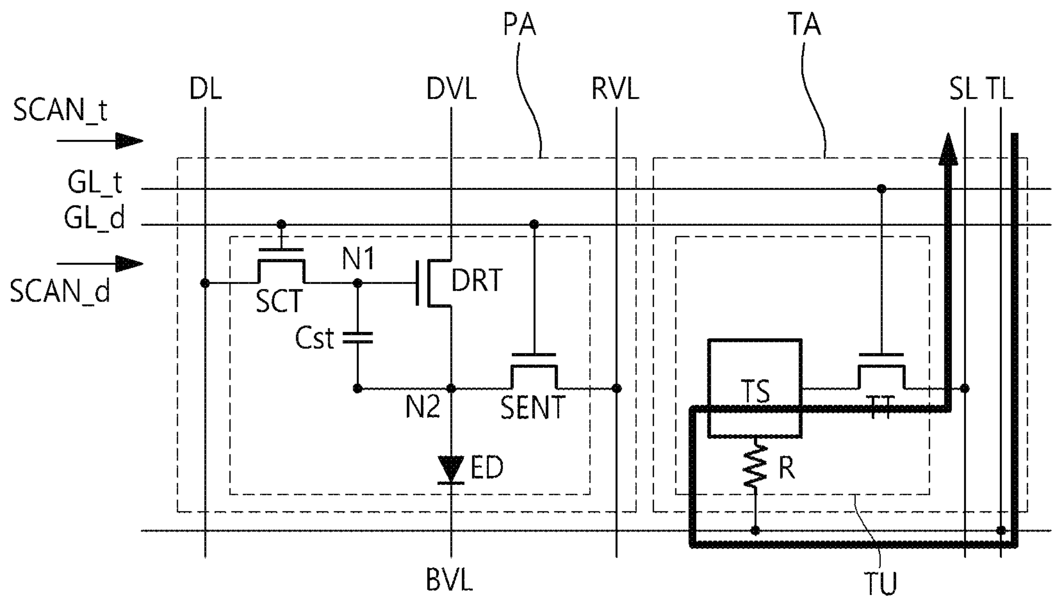
FIG. 5 is an equivalent circuit diagram of a pixel area and a transmission area according to embodiments of the present disclosure.

FIG. 5 is an equivalent circuit diagram of a pixel area PA and a transmission area TA according to embodiments of the present disclosure.

Referring to FIG. 5, the pixel area PA may be an area where the subpixel SP is disposed. The subpixel SP may include a light emitting device ED, a scan transistor SCT, a driving transistor DRT, and a storage capacitor Cst. In this case, the structure of the subpixel SP may be referred to as a 2TIC subpixel. In addition, the subpixel SP may further include a sensing transistor SENT. In this case, the structure of the subpixel SP may be referred to as a 3TIC subpixel. In addition, the subpixel SP may be designed with a subpixel structure such as 6TIC capable of internal compensation. However, hereinafter, for convenience of explanation, the structure of the subpixel SP will be described assuming a 3T1C subpixel. Therefore, embodiments of the present disclosure may be applicable to all subpixels SP such as 2T1C, 3TIC, and 6T1C.

The subpixel SP may include a driving transistor DRT, a scan transistor SCT, a sensing transistor SENT, a light emitting device ED, and a storage capacitor Cst. The subpixel SP shown in FIG. 5 may be the same as the subpixel SP shown in FIGS. 2A and 2B, and it will be omitted the overlapping descriptions.

The driving transistor DRT may be electrically connected between a second node and a third node N3. The driving transistor DRT may be a transistor for driving the light emitting device ED. The third node N3 may be electrically connected to a driving voltage line DVL.

The scan transistor SCT may be electrically connected between a data line DL and a first node N1. A gate node of the scan transistor SCT may be electrically connected to an image gate line GL_d. The scan transistor SCT may be controlled by an image scan signal SCAN_d supplied to the gate node of the scan transistor SCT.

The sensing transistor SENT may be electrically connected between a reference voltage line RVL and the second node N2. A gate node of the sensing transistor SENT may be electrically connected to the image gate line GL_d. The sensing transistor SENT may be controlled by the image scan signal SCAN_d supplied to the gate node of the sensing transistor SENT.

The light emitting device ED may be electrically connected between the second node N2 and a base voltage line BVL. The light emitting device ED may emit light corresponding to a driving current.

The storage capacitor Cst may be electrically connected between the first node N1 and the second node N2. The storage capacitor Cst may store a voltage corresponding to the difference between a voltage of the first node N1 and a voltage of the second node N2.

The transmission area TA may be an area where a touch unit TU for touch is disposed. The touch unit TU may include a touch sensor TS, a touch transistor TT, and a sensing resistor R.

The touch sensor TS may be electrically connected between the touch transistor TT and the sensing resistor R.

The touch sensor TS may be made of an opaque material or a transparent material.

The sensing resistor R may be electrically connected between a touch signal supply line TL and the touch sensor TS.

The touch transistor TT may be electrically connected between a touch signal sensing line SL and the touch sensor TS. A gate node of the touch transistor TT may be electrically connected to a touch gate line GL_t. The touch transistor TT may be controlled by a touch scan signal SCAN_t supplied to the gate node of the touch transistor TT.

Figure 21:
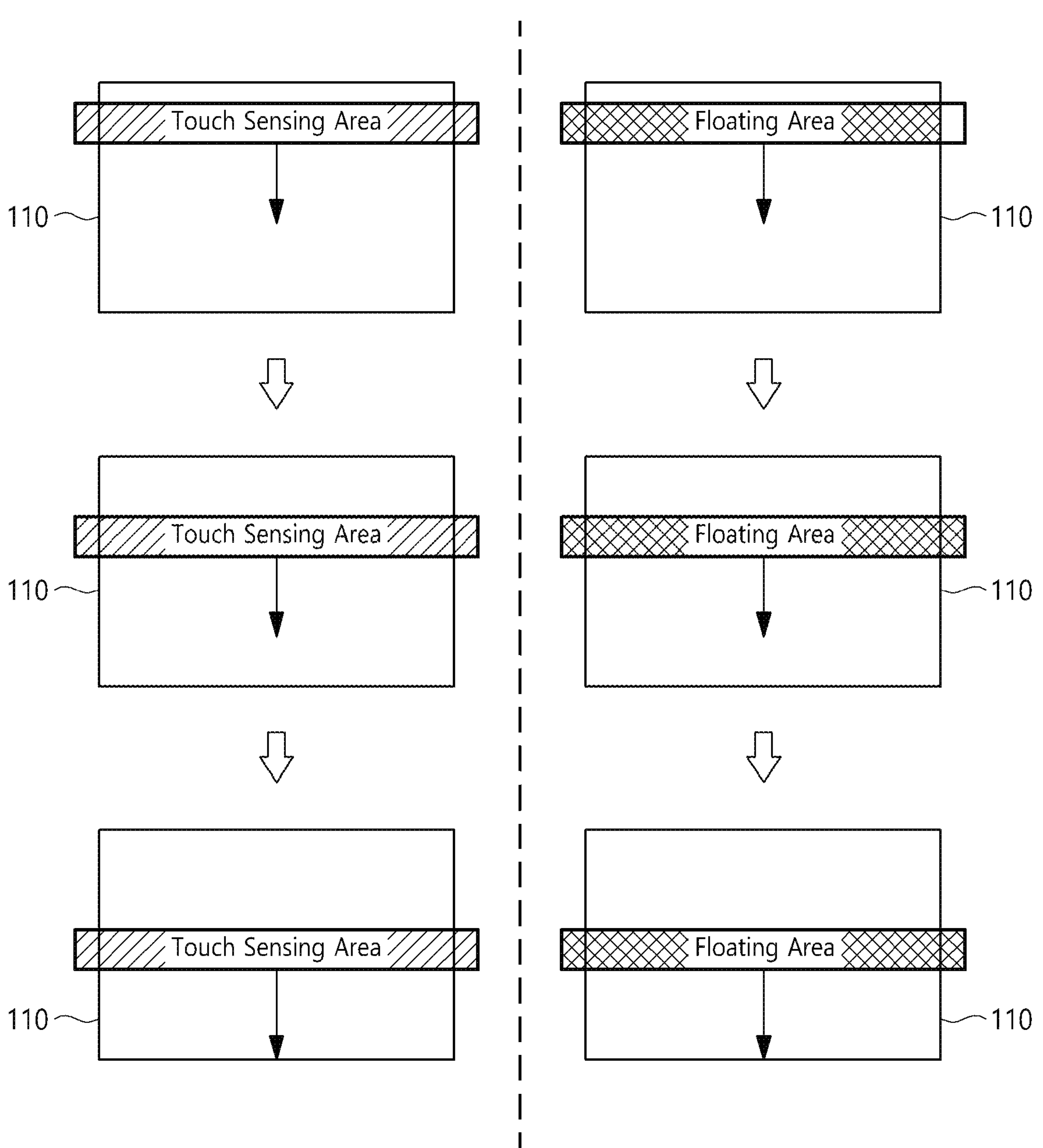
FIGS. 21 to 24 illustrate a touch sensing area and a local floating area according to embodiments of the present disclosure.

The touch signal supply line TL and the touch signal sensing line SL may be referred to as the touch sensing lines. That is, the touch sensing line may include a touch signal supply line TL and a touch signal sensing line SL. Referring to FIGS. 5 and 21, the touch signal supply line (TL and the touch signal sensing line SL may be expressed as a touch sensing line.

The touch signal supply line TL may receive a touch driving signal. The touch driving signal may be supplied to the touch sensor TS through the sensing resistor R. When the touch scan signal SCAN_t for switching the touch transistor TT to the turn-on state is supplied to the gate node of the touch transistor TT, the touch signal sensing line SL and the touch sensor TS may be electrically connected. In this case, there may be determined the presence or absence of touch based on the signal supplied to the touch signal sensing line SL.

Hereinafter, it will be described a method of driving the subpixel SP and the touch unit TU.

Figure 6:
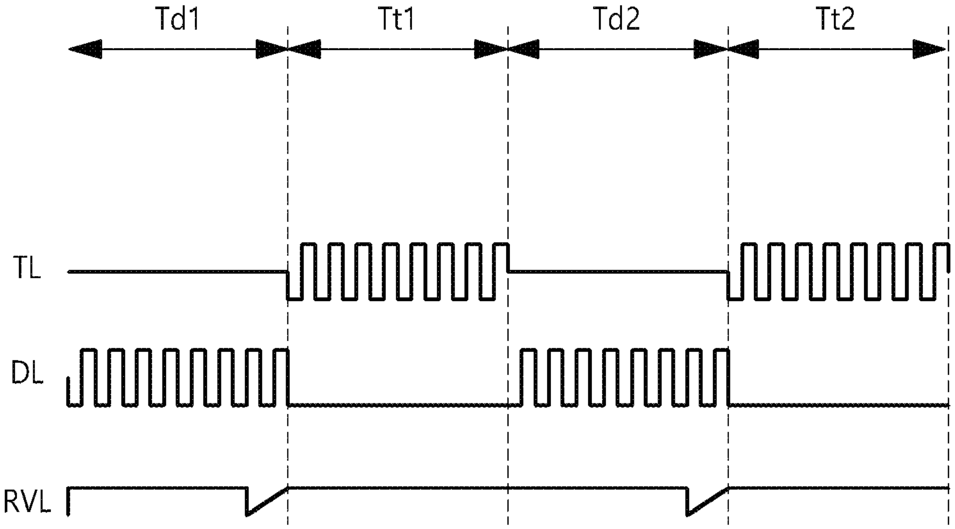
FIG. 6 is a driving timing diagram for driving a subpixel and a touch sensor according to embodiments of the present disclosure.

FIG. 6 is a driving timing diagram for driving a subpixel SP and a touch sensor TS according to embodiments of the present disclosure.

Referring to FIG. 6, a period for driving the display device 100 may include an image display driving period and a touch driving period Tt.

The image display driving period Td may be a period for controlling the subpixel SP.

The touch driving period Tt may be a period for controlling the touch unit TU.

The image display driving period Td may be a different period from the touch driving period Tt. That is, the display device 100 may be driven with image display driving and touch driving separated in time. Referring to FIG. 6, a period during which the display device 100 is driven may include a first image display driving period Td, a first touch driving period Tt, a second image display driving period Td, and a second touch driving period Tt in order.

Referring to FIG. 6, a data voltage may be supplied to the data line DL during the image display driving period Td. Additionally, a reference voltage may be supplied to the reference voltage line RVL.

Referring to FIG. 6, for convenience of explanation, the data voltage is shown in a sinusoidal shape. However, during the image display driving period Td, the size of the data voltage may change to correspond to the luminance of the corresponding subpixel SP.

Referring to FIG. 6, the image display driving period Td may be divided into a front and rear period, and there is illustrated a case in which the voltage supplied to the reference voltage line RVL may vary in the rear period of the image display driving period Td. The image display driving period Td may include an active period for driving the image display and a blank period for sensing the characteristic value of the subpixel SP. Referring to FIG. 6, a period during which the voltage of the reference voltage line RVL changes may correspond to a blank period.

Referring to FIG. 6, during the touch driving period Tt, a touch driving signal may be supplied through the touch signal supply line TL. Referring to FIG. 6, for convenience of explanation, the touch driving signal is shown as a sine wave with the same voltage amplitude and period, but the voltage amplitude and period may not be constant depending on the design.

That is, the image display driving period Td may be a period for controlling the subpixel SP, and there may be controlled the voltage supplied to the data line DL and the reference voltage line RVL during the image display driving period Td. The touch driving period Tt may be a period in which the touch unit TU is controlled, and there may be controlled the voltage supplied through the touch signal supply line TL during the touch driving period Tt.

Meanwhile, referring to FIG. 6, the data line DL and the reference voltage line RVL may be maintained at a constant voltage during the touch driving period Tt. In this case, the voltage supplied to the data line DL and the voltage supplied to the reference voltage line RVL may affect the touch signal supply line TL. That is, the touch signal supply line TL may be coupled with the data line DL and the reference voltage line RVL, so that the load on the touch signal supply line TL may increase. In this case, there may be occurred a problem of lowering the touch sensitivity.

Accordingly, embodiments of the present disclosure may provide a display device capable of stably controlling the subpixel SP during the touch driving period Tt.

Embodiments of the present disclosure may provide a display device in which the subpixel SP does not affect touch driving during the touch driving period Tt.

Embodiments of the present disclosure may provide a display device capable of improving touch sensitivity.

Embodiments of the present disclosure may provide a display device capable of low power consumption by improving touch sensitivity.

Figure 7:
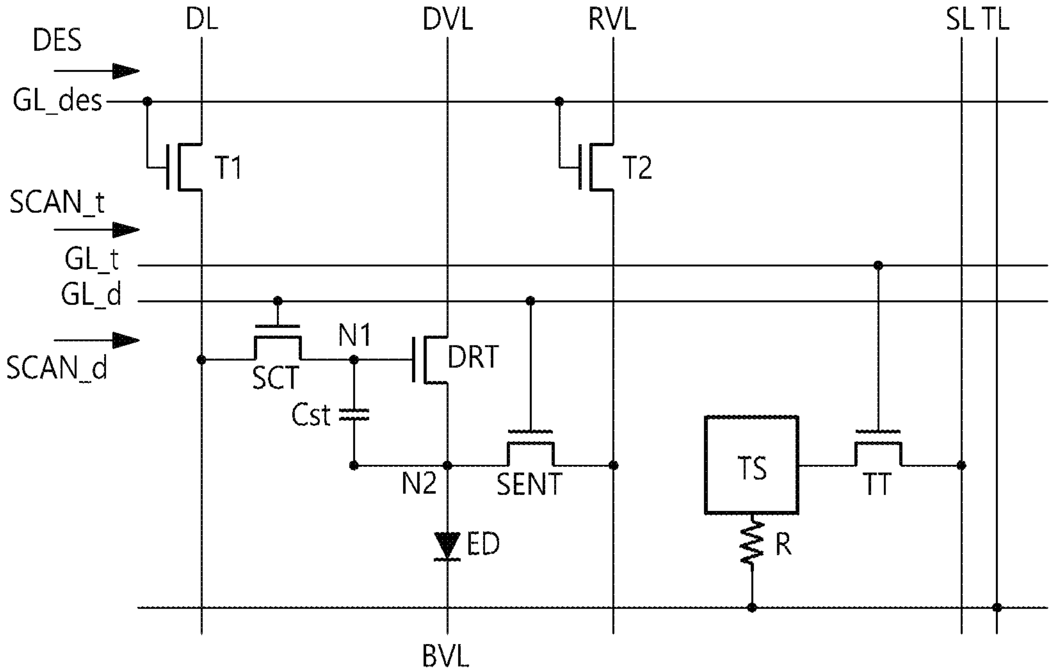
FIG. 7 is an equivalent circuit diagram of a pixel area and a transmission area according to embodiments of the present disclosure.
Figure 8:
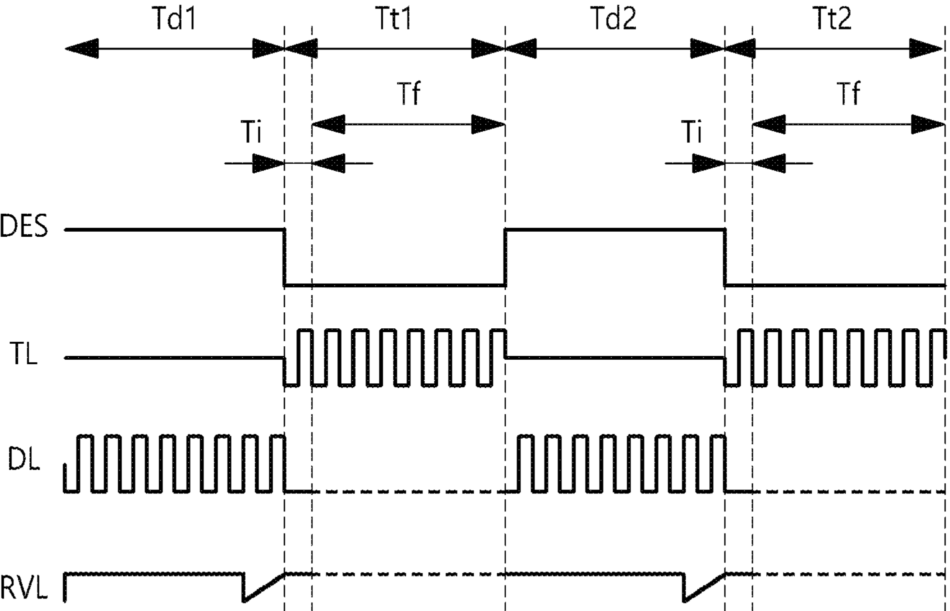
FIG. 8 is a driving timing diagram for driving a subpixel and a touch sensor according to embodiments of the present disclosure.

FIG. 7 is an equivalent circuit diagram of a pixel area PA and a transmission area TA according to embodiments of the present disclosure. FIG. 8 is a driving timing diagram for driving a subpixel SP and a touch sensor TS according to embodiments of the present disclosure.

Referring to FIG. 7, the display device 100 may further include a first control transistor T1 and a second control transistor T2.

Referring to FIG. 7, the first control transistor T1 may be electrically connected between the scan transistor SCT and the data line DL.

Referring to FIG. 7, the second control transistor T2 may be electrically connected between the sensing transistor SENT and the reference voltage line RVL.

A driving control gate line GL_des may be electrically connected to a gate node of the first control transistor T1 and a gate node of the second control transistor T2.

A driving control signal DES may be supplied to the gate node of the first control transistor T1 and the gate node of the second control transistor T2.

When a driving control signal DES of a turn-on level is supplied to the gate node of the first control transistor T1, the data line DL and the scan transistor SCT may be electrically connected. When the driving control signal DES of the turn-on level is supplied to the gate node of the second control transistor T2, the reference voltage line RVL and the sensing transistor SENT may be electrically connected.

When a driving control signal DES of a turn-off level is supplied to the gate node of the first control transistor T1, the data line DL and the scan transistor SCT may be electrically separated. When the driving control signal DES of the turn-off level is supplied to the gate node of the second control transistor T2, the reference voltage line RVL and the sensing transistor SENT may be electrically separated.

Referring to FIG. 8, the driving control signal DES may be in a high-level state during the image display driving period Td. The driving control signal DES may be in a low-level state during the touch driving period Tt. That is, the voltage level of the driving control signal DES during the image display driving period Td may be different from the voltage level of the driving control signal DES during the touch driving period Tt.

Referring to FIG. 8, the touch driving period Tt may include an initialization voltage supply period T1 and a floating period Tf. Referring to FIG. 8, a first touch driving period Tt and a second touch driving period Tt may each include an initialization voltage supply period Ti and a floating period Tf.

The initialization voltage supply period Ti may be a period in which a line initialization voltage is supplied to the data line DL and the reference voltage line RVL. The floating period Tf may be a period in which the driving control signal DES is supplied to maintain the first control transistor T1 and the second control transistor T2 in a turn-off state.

Since the line initialization voltage is supplied to the data line DL and the reference voltage line RVL during the initialization voltage supply period Ti, there may be eliminated the influence of the data line DL and the reference voltage line RVL on the touch signal supply line TL.

The level of the line initialization voltage may be similar to the level of the voltage supplied to the touch sensing line. Alternatively, the line initialization voltage may be the same as the voltage flowing in the touch signal supply line TL.

Referring to FIG. 8, during the initialization voltage supply period Ti, the driving control signal DES may be in a low-level state. However, the driving control signal DES may be in a high-level state during the initialization voltage supply period Ti, and may change to a low-level state during the floating period Tf.

After the initialization voltage supply period Ti, a floating period Tf may proceed. During the floating period Tf, the first control transistor T1 and the second control transistor T2 may be switched to a turn-off state. In this case, the first control transistor T1 and the second control transistor T2 may be in a floating state. Accordingly, there may be eliminated the influence of the data line DL and the reference voltage line RVL on the touch signal supply line TL.

The first control transistor T1 may be disposed for each data line DL, and the second control transistor T2 may be disposed for each reference voltage line RVL. During the touch driving period Tt, the driving lines adjacent to the touch sensing line are in a floating state, so that the driving lines DL and RVL in the floating state may not affect the touch sensing line.

Figure 11:
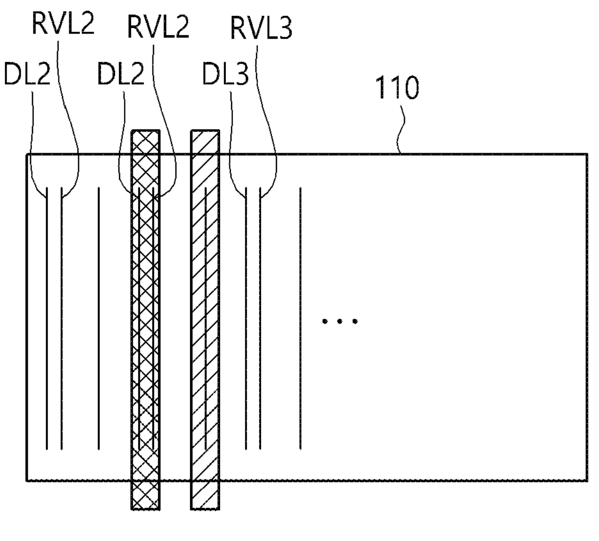
FIG. 11 illustrates a touch sensing line and a floating line according to embodiments of the present disclosure.

Referring to FIG. 11, there can be seen that the driving lines (e.g., floating lines 1) adjacent to the touch sensing line are floating.

The touch sensing line, the data line DL, and the reference voltage line RVL may be arranged as follows. A second data line DL2 and a second reference voltage line RVL2 may be disposed on the left side of a second touch sensing line TSL2, and a third data line DL3 and a third reference voltage line RVL3 may be disposed adjacent to the right side of the second touch sensing line TSL2. For convenience of explanation, the second data line DL2 and the second reference voltage line RVL2 may be referred to as a second column driving line, and the third data line DL3 and the third reference voltage line RVL3 may be referred to as a third column driving line.

The second touch sensing line TSL2 may be adjacent to the second column driving line. In this case, control transistors electrically connected to the second column driving line may be turned off. Accordingly, the second touch sensing line TSL2 may not be affected by the floating second column driving line. Referring to FIG. 11, the second column driving lines may be driving lines (i.e., floating lines 1).

The second touch sensing line TSL2 may be adjacent to the third column driving line. In this case, control transistors electrically connected to the third column driving line may be turned off. Accordingly, the second touch sensing line TSL2 may not be affected by the third column driving line which is in a floating state.

However, unlike what is shown in FIG. 8, the touch driving period Tt may not include an initialization voltage supply period Ti. That is, the touch driving period Tt may include only the floating period Tf. Even in this case, there may be eliminated the influence of the data line DL and the reference voltage line RVL on the touch signal supply line TL.

That is, during the touch driving period Tt, the driving lines (e.g., DL and RVL) adjacent to the touch sensing line may be in a floating state, and the driving lines (e.g., DL and RVL) in the floating state may not affect the touch sensing line.

Figure 9:
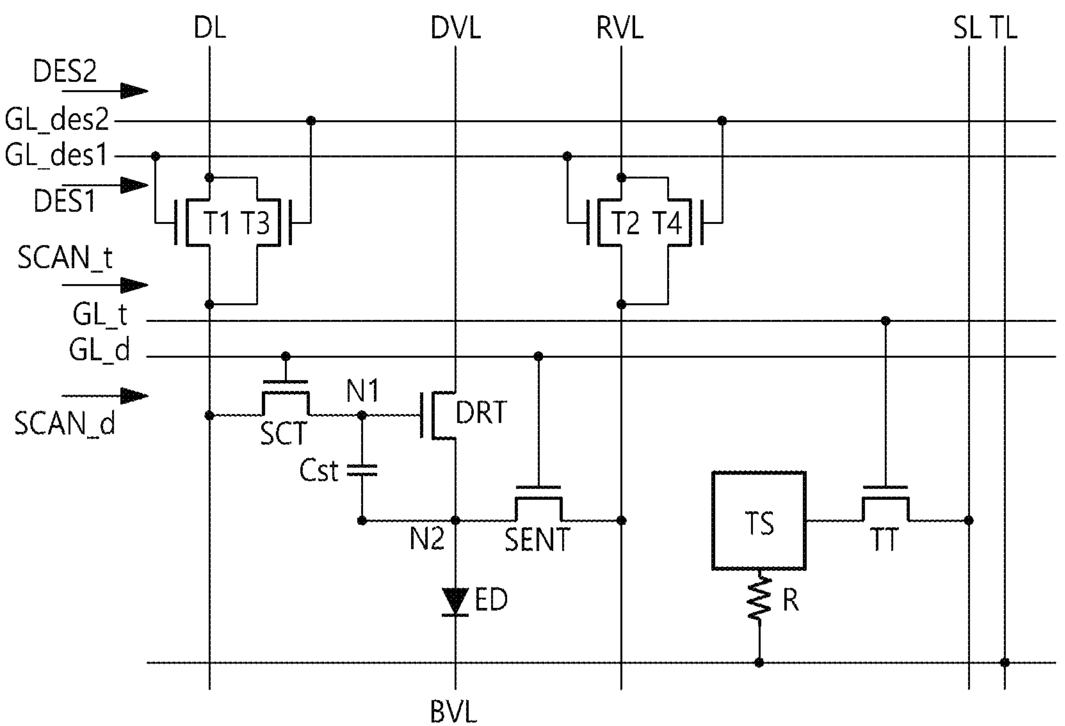
FIG. 9 is an equivalent circuit diagram of a pixel area and a transmission area according to embodiments of the present disclosure.
Figure 10:
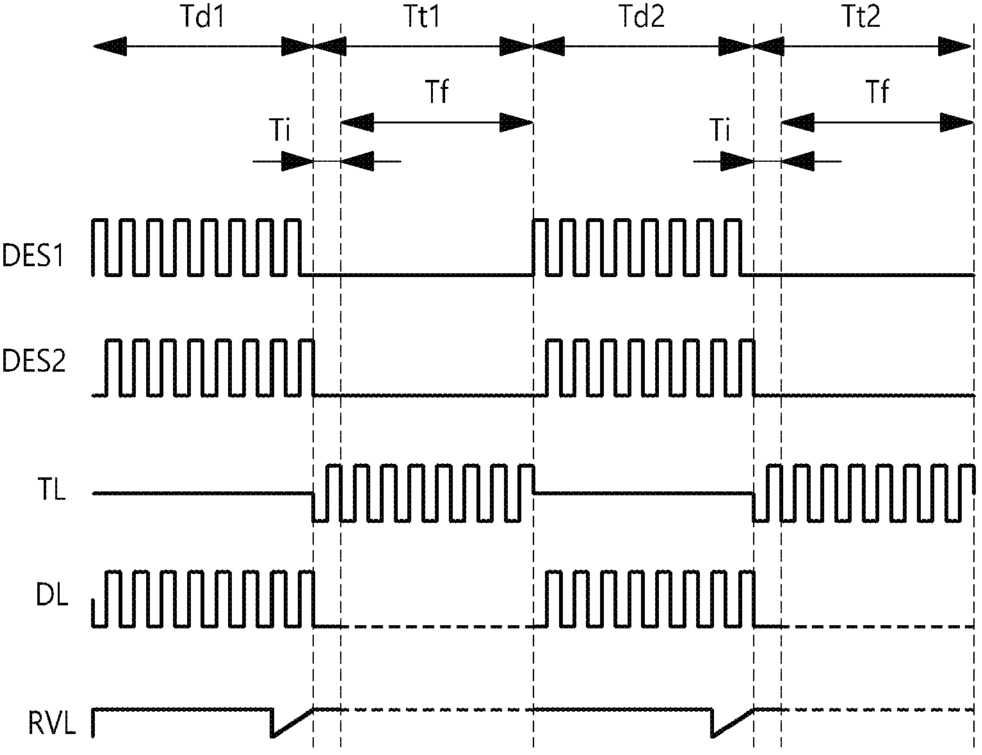
FIG. 10 is a driving timing diagram for driving a subpixel and a touch sensor according to embodiments of the present disclosure.

Meanwhile, referring to FIGS. 9 and 10, the display device 100 may further include a third control transistor T3 and a fourth control transistor T4.

FIG. 9 is an equivalent circuit diagram of a pixel area PA and a transmission area TA according to embodiments of the present disclosure. FIG. 10 is a driving timing diagram for driving a subpixel SP and a touch sensor TS according to embodiments of the present disclosure.

Referring to FIG. 9, the first control transistor T1 may be electrically connected between the scan transistor SCT and the data line DL.

Referring to FIG. 9, the second control transistor T2 may be electrically connected between the sensing transistor SENT and the reference voltage line RVL.

Referring to FIG. 9, the third control transistor T3 may be electrically connected between the scan transistor SCT and the data line DL.

Referring to FIG. 9, the fourth control transistor T4 may be electrically connected between the sensing transistor SENT and the reference voltage line RVL.

A first driving control gate line GL_des1 may be electrically connected to a gate node of the first control transistor T1 and a gate node of the second control transistor T2. A first driving control signal DES1 may be supplied to the gate node of the first control transistor T1 and the gate node of the second control transistor T2.

A second driving control gate line GL_des2 may be electrically connected to a gate node of the third control transistor T3 and a gate node of the fourth control transistor T4. A second driving control signal DES2 may be supplied to the gate node of the third control transistor T3 and the gate node of the fourth control transistor T4.

Referring to FIG. 10, during the touch driving period Tt, the first driving control signal DES1 and the second driving control signal DES2 may be a voltage level to turn off the control transistors T1, T2, T3 and T4. For example, during the touch driving period Tt, the first driving control signal DES1 and the second driving control signal DES2 may be low-level signals.

Referring to FIG. 10, the touch driving period Tt may include an initialization voltage supply period T1 and a floating period Tf. The characteristics of the initialization voltage supply period T1 and the floating period Tf shown in FIG. 10 may be the same as the characteristics of the initialization voltage supply period T1 and the floating period Tf shown in FIG. 8.

A data voltage may be supplied through the data line DL during the image display driving period Td. Therefore, at least one of the first control transistor T1 or the third control transistor is in a turn-on state. In addition, a reference voltage may be supplied through the reference voltage line RVL during the image display driving period Td. To this end, at least one transistor of the second control transistor T2 or the fourth control transistor T4 is in a turn-on state.

Referring to FIG. 10, during the image display driving period Td, the first control transistor T1 and the third control transistor T3 may be alternately turned on. Accordingly, it is possible to reduce the stress experienced by the first control transistor T1 and the third control transistor T3. The method of alternating in which the first control transistor T1 and the third control transistor T3 may be designed in various ways. The alternating times may be equalized, or the alternating times may be unequally set. In addition, both the first control transistor T1 and the third control transistor T3 may be turned on during the image display driving period Td.

Referring to FIG. 10, during the image display driving period Td, the second control transistor T2 and the fourth control transistor T4 may be alternately turned on. Therefore, it is possible to reduce, the stress experienced by the second control transistor T2 and the fourth control transistor T4. The method of alternatively driving the second control transistor T2 and the fourth control transistor T4 may be designed in various ways. The alternating times may be equalized, or the second control transistor T2 and the fourth control transistor T4 may be set to alternate for unequal times. Additionally, both the second control transistor T2 and the fourth control transistor T4 may be turned on during the image display driving period Td.

During the touch driving period Tt, the driving lines (e.g., DL and RVL) adjacent to the touch sensing line may be in a floating state, and the floating driving lines DL and RVL may not affect the touch sensing line.

Referring to FIG. 11, there is illustrated that the driving lines (i.e., floating lines 1) adjacent to the touch sensing line are floating.

For example, during the touch driving period Tt, the second touch sensing line TSL2 may be adjacent to the second column driving line. In this case, the control transistors electrically connected to the second column driving line may be turned off. Accordingly, the second touch sensing line TSL2 may not be affected by the floating second column driving line. Referring to FIG. 11, the second column driving lines may be driving lines (i.e., floating lines 1).

For example, during the touch driving period Tt, the second touch sensing line TSL2 may be adjacent to the third column driving line. In this case, the control transistors electrically connected to the third column driving line may be turned off. Accordingly, the second touch sensing line TSL2 may not be affected by the third column driving line that is in a floating state.

Figure 12:
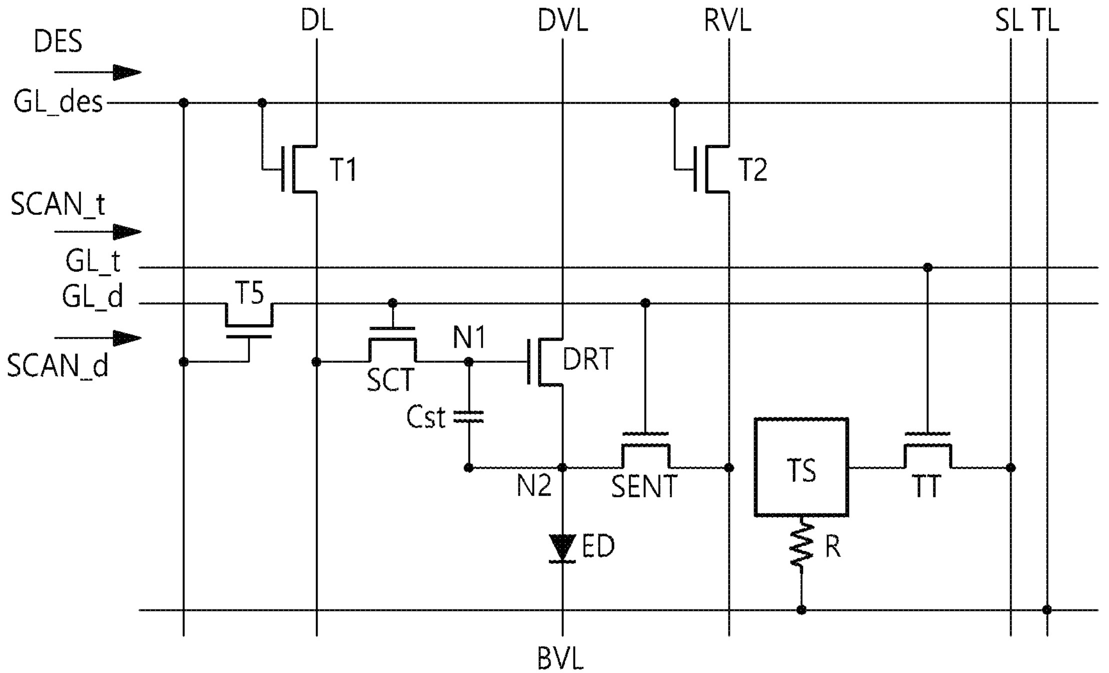
FIG. 12 is an equivalent circuit diagram of a pixel area and a transmission area according to embodiments of the present disclosure.
Figure 13:
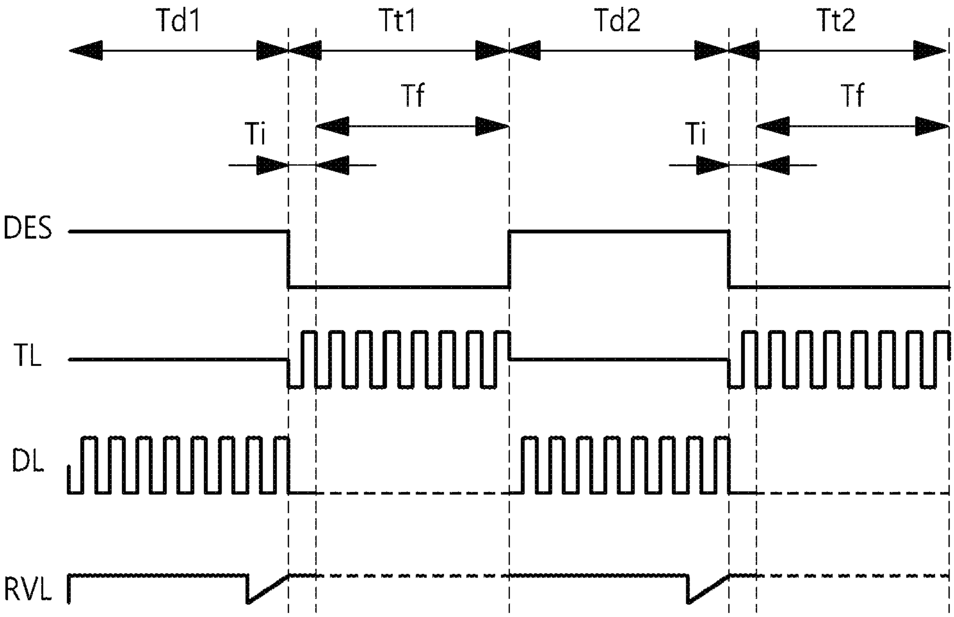
FIG. 13 is a driving timing diagram for driving a subpixel and a touch sensor according to embodiments of the present disclosure.

FIG. 12 is an equivalent circuit diagram of a pixel area PA and a transmission area TA according to embodiments of the present disclosure. FIG. 13 is a driving timing diagram for driving a subpixel SP and a touch sensor TS according to embodiments of the present disclosure.

Referring to FIG. 12, the first control transistor T1 may be electrically connected between the scan transistor SCT and the data line DL.

Referring to FIG. 12, the second control transistor T2 may be electrically connected between the sensing transistor SENT and the reference voltage line RVL.

Referring to FIG. 12, a fifth control transistor T5 may be electrically connected between the driving control gate line GL_des and the gate node of the scan transistor SCT. The fifth control transistor T5 may be electrically connected between the driving control gate line GL_des and the gate node of the sensing transistor SENT.

The driving control gate line GL_des may be electrically connected to the gate node of the first control transistor T1 and the gate node of the second control transistor T2. Additionally, the driving control gate line GL_des may be electrically connected to a gate node of the fifth control transistor T5.

A driving control signal DES may be supplied to the gate node of the first control transistor T1, the gate node of the second control transistor T2, and the gate node of the fifth control transistor T5.

Referring to FIG. 13, the driving control signal DES may be at a high-level during the image display driving period Td. The driving control signal DES may be in a low-level state during the touch driving period Tt. That is, the voltage level of the driving control signal DES during the image display driving period Td may be different from the voltage level of the driving control signal DES during the touch driving period Tt.

The touch driving period Tt may include an initialization voltage supply period Ti and a floating period Tf.

During the floating period Tf, the first control transistor T1, the second control transistor T2, and the fifth control transistor T5 may be in a turn-off state.

During the touch driving period Tt, the driving lines DL and RVL adjacent to the touch sensing line may be in a floating state, and the floating driving lines DL and RVL may not affect the touch sensing line. In this case, as the fifth control transistor T5 is turned off, the driving control signal DES may not be supplied through the driving control gate line GL_des electrically connected to the fifth control transistor T5. That is, the scan transistor SCT and sensing transistor SENT may be maintained in a more stable turn-off state.

Figure 14:
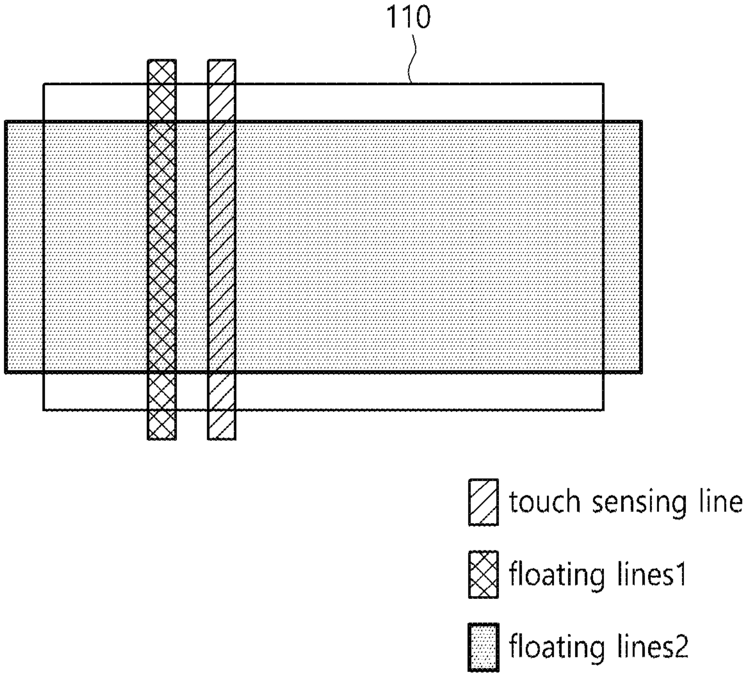
FIG. 14 illustrates a touch sensing line and a floating line according to embodiments of the present disclosure.

Referring to FIG. 14, there is illustrated that not only the vertically arranged driving lines (i.e., floating lines 1) but also the horizontally arranged gate lines (i.e., floating lines 2) are floating. Since the gate lines (i.e., floating lines 2) arranged in the horizontal direction are also floating, the scan transistor SCT and sensing transistor SENT electrically connected to the corresponding gate lines may be maintained in a turned-off state.

That is, since the horizontally adjacent gate lines (i.e., floating lines 2) in addition to the vertically adjacent driving lines (i.e., floating lines 1) are maintained in a floating state, the floating lines (i.e., floating lines 1, and floating lines 2) may not affect the touch sensing line.

Figure 20:
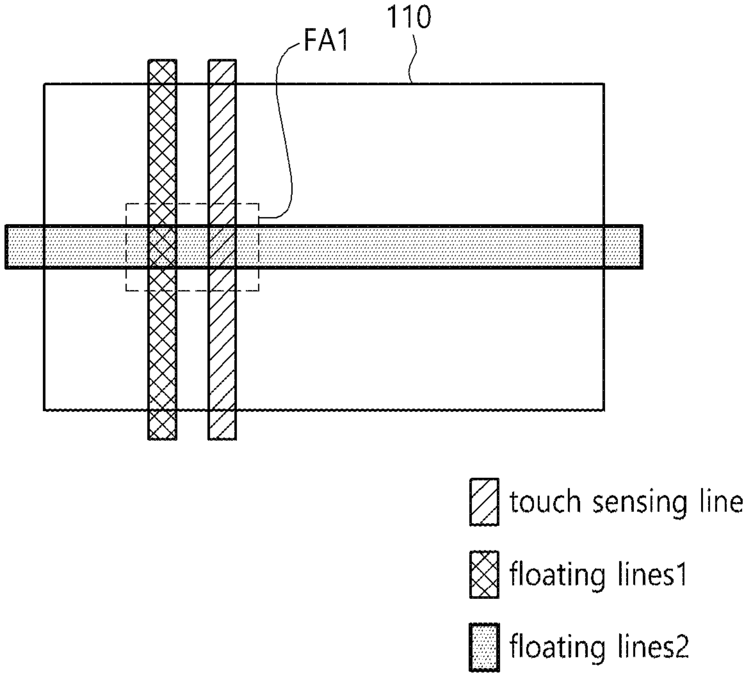
FIG. 20 illustrates a touch sensing line and a floating line according to embodiments of the present disclosure.

According to the connection of the fifth control transistor T5 of FIG. 12, the horizontally adjacent gate lines (i.e., floating lines 2) as shown in FIG. 20 may be maintained in a floating state for a selective range, so that the floating lines (i.e., floating lines 1 and floating lines 2) may not affect the touch sensing line.

Figure 15:
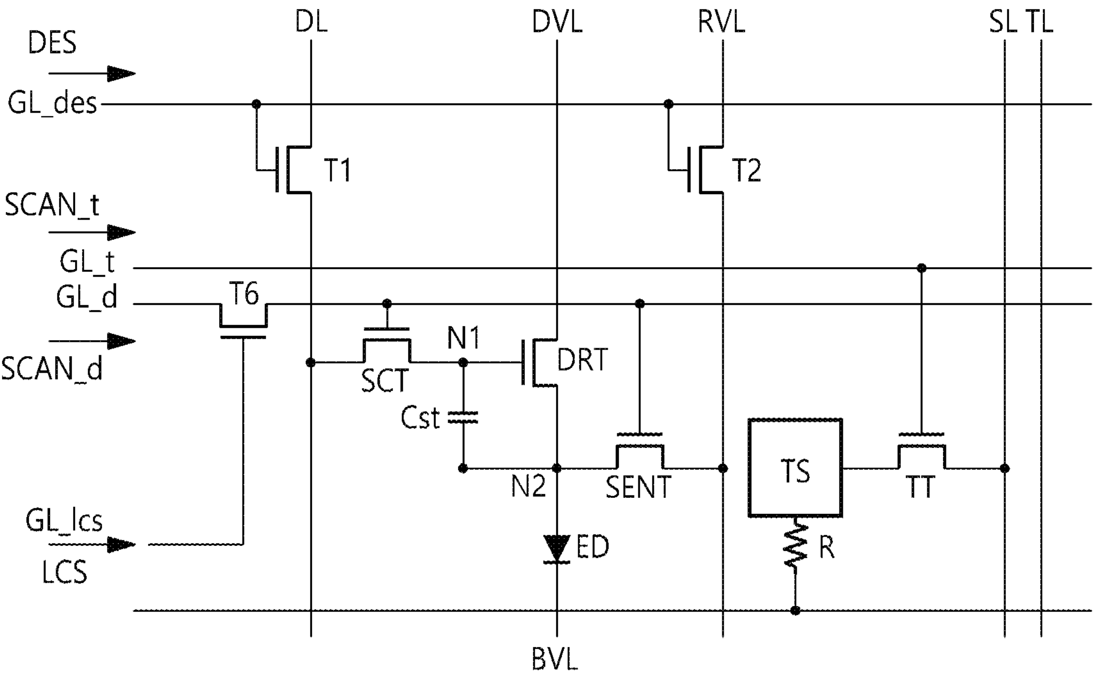
FIG. 15 is an equivalent circuit diagram of a pixel area and a transmission area according to embodiments of the present disclosure.
Figure 16:
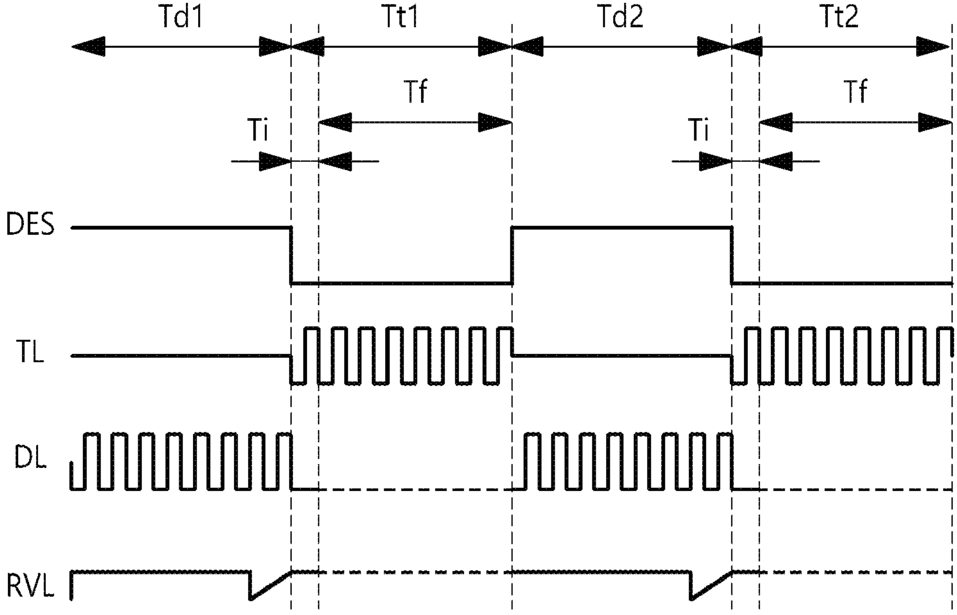
FIG. 16 is a driving timing diagram for driving a subpixel and a touch sensor according to embodiments of the present disclosure.

FIG. 15 is an equivalent circuit diagram of a pixel area PA and a transmission area TA according to embodiments of the present disclosure. FIG. 16 is a driving timing diagram for driving a subpixel SP and a touch sensor TS according to embodiments of the present disclosure.

Referring to FIG. 15, the first control transistor T1 may be electrically connected between the scan transistor SCT and the data line DL.

Referring to FIG. 15, the second control transistor T2 may be electrically connected between the sensing transistor SENT and the reference voltage line RVL.

Referring to FIG. 15, a sixth control transistor T6 may be electrically connected between the driving control gate line GL_des and a gate node of the scan transistor SCT. The sixth control transistor T6 may be electrically connected between the driving control gate line GL_des and a gate node of the sensing transistor SENT.

The driving control gate line GL_des may be electrically connected to the gate node of the first control transistor T1 and the gate node of the second control transistor T2. A driving control signal DES may be supplied to the gate node of the first control transistor T1 and the gate node of the second control transistor T2.

A local control gate line GL_lcs may be electrically connected to the gate node of the sixth control transistor T6.

A local control signal LCS may be supplied to the gate node of the sixth control transistor T6. As the local control signal LCS is supplied to the gate node of the sixth control transistor T6, a local floating driving may be implemented.

If a turn-on local control signal LCS is supplied to the driving control gate line GL_des, the sixth transistor T6 may be turned on. The turn-on local control signal LCS may be a signal for switching the sixth transistor T6 to the turn-on state. After the sixth transistor T6 is turned on, an image scan signal SCAN_d may be supplied to an image gate line GL_d.

If a turn-off local control signal LCS is supplied to the driving control gate line GL_des, the sixth transistor T6 may be turned off. The turn-off local control signal LCS may be a signal for switching the sixth transistor T6 to the turn-off state. After the sixth transistor T6 is turned off, the image scan signal SCAN_d may not be supplied to the image gate line GL_d. Since the image scan signal SCAN_d is not supplied to the image gate line GL_d, the image gate line GL_d may be in a floating state. Since the image gate line GL_d is in the floating state, this may be referred to as a local floating driving. In addition, since the sixth transistor T6 is turned off, this may be referred to as a local off driving. That is, local floating driving may also be referred to as a local off driving. Hereinafter, it will be described the local floating driving in more detail.

Referring to FIG. 16, there is illustrated the image display driving period Td and the touch driving period Tt, which are the same as the signal characteristics shown in FIG. 8.

Figure 17:
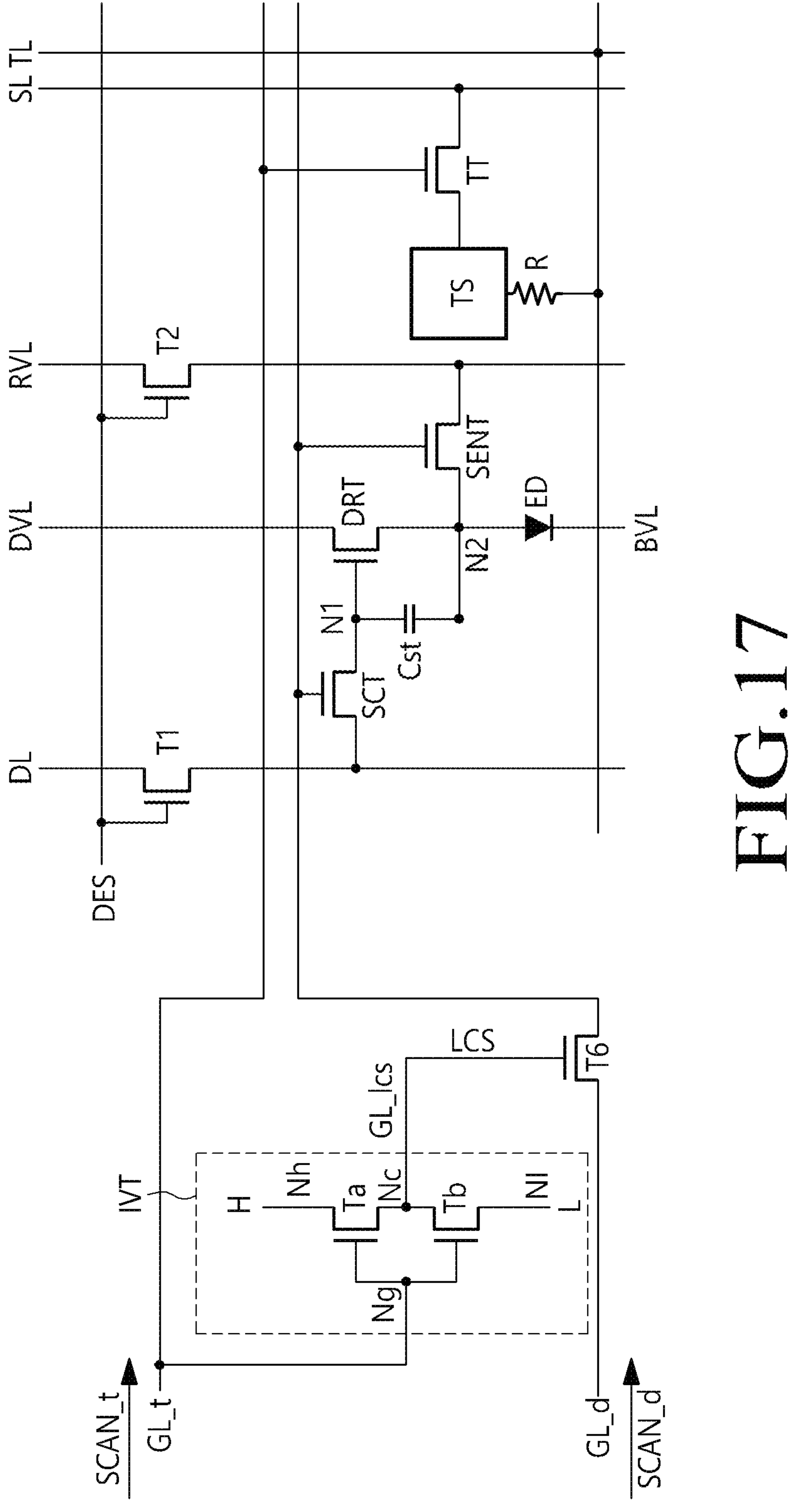
FIG. 17 is an equivalent circuit diagram of a pixel area and a transmission area according to embodiments of the present disclosure.

Referring to FIG. 17, there is illustrated an example diagram of an inverter circuit IVT which generates a local control signal LCS.

The inverter circuit IVT may receive a specific signal and then output a signal opposite to that specific signal.

Referring to FIG. 17, the inverter circuit IVT may be electrically connected between a touch gate line GL_t and a local control gate line GL_lcs.

Referring to FIG. 17, the inverter circuit IVT may receive a touch scan signal SCAN_t. The inverter circuit IVT may output a local control signal LCS.

Referring to FIG. 17, the inverter circuit IVT may include a first inverter transistor Ta and a second inverter transistor Tb.

Referring to FIG. 17, the first inverter transistor Ta may be electrically connected between a high voltage node Nh and a connection node Nc.

Referring to FIG. 17, the second inverter transistor Tb may be electrically connected between the connection node Nc and a low voltage node N1.

Referring to FIG. 17, a gate node of the first inverter transistor Ta and a gate node of the second inverter transistor Tb may be electrically connected.

Referring to FIG. 17, the gate node of the first inverter transistor Ta may be electrically connected to the touch gate line GL_t.

Referring to FIG. 17, a gate node of the second inverter transistor Tb may be electrically connected to the touch gate line GL_t.

Referring to FIG. 17, the connection node Nc may be electrically connected to a gate node of the sixth control transistor T6.

Referring to FIG. 17, the connection node Nc may be electrically connected to the local control gate line GL_lcs. A local control signal LCS may be output through the connection node Nc.

Figure 18:
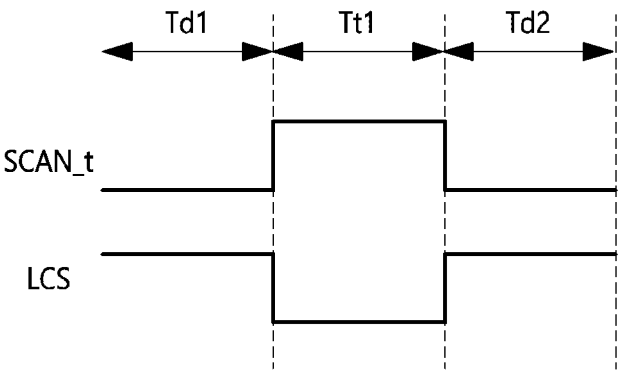
FIGS. 18 and 19 are driving timing diagrams for driving subpixels and touch sensors according to embodiments of the present disclosure.

Referring to FIGS. 17 and 18, the inverter circuit IVT may output a local control signal LCS having a voltage level opposite to the touch scan signal SCAN_t.

Referring to FIG. 18, if the inverter circuit IVT receives a high-level touch scan signal SCAN_t, the inverter circuit IVT may output a low-level local control signal LCS. Conversely, if the inverter circuit IVT receives the touch scan signal SCAN_t of a low-level, the inverter circuit IVT may output the local control signal LCS of a high-level.

Figure 19:
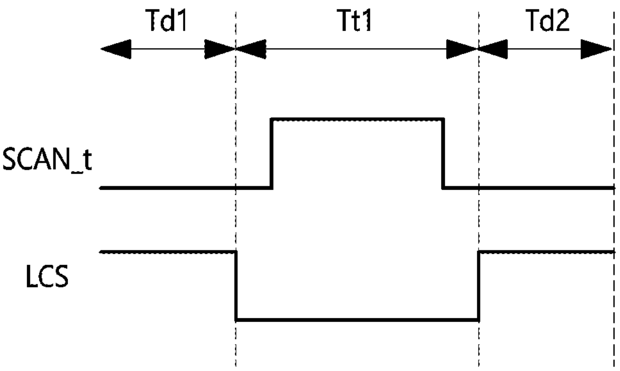

Referring to FIG. 19, a width of a period when the local control signal LCS is in a low-level state may be wider than a width of a period when the touch scan signal SCAN_t is in a high-level state. In this case, the control stability of the circuit may be further improved. In order to implement the signal timing shown in FIG. 17, a delay circuit may be added to the inverter circuit IVT shown in FIG. 17. Alternatively, the inverter circuit IVT shown in FIG. 17 may not be disposed, and the touch gate line GL_t and the local control gate line GL_lcs may be electrically separated from each other.

Referring to FIG. 20, there can be seen that not only the vertically arranged driving lines (i.e., floating lines 1) but also some of the horizontally arranged gate lines (i.e., floating lines 2) are floating. Since the horizontally arranged gate lines (i.e., floating lines 2) are also floating, the scan transistor SCT and sensing transistor SENT electrically connected to the corresponding gate lines may be maintained in a turned-off state.

That is, since not only the vertically adjacent driving lines (i.e., floating lines 1) but also some horizontally adjacent gate lines (i.e., floating lines 2) are maintained in a floating state, the floating lines (i.e., floating lines 1 and floating lines 2) may not affect the touch sensing line. Since only some gate lines (e.g., floating lines 2) are floating, this may be called "a local floating driving."

Referring to FIG. 20, a floating area FA1 may be adjacent to an area where touch sensing is in progress. In the local floating driving, the driving control signal DES may not be supplied to some gate lines, and the scan transistor SCT and sensing transistor SENT may be maintained in a more stable turn-off state. In addition, the driving lines (e.g., floating lines 1) adjacent to the touch sensing line may be floating, so that it is possible to prevent the influence of the driving lines (e.g., floating lines 1) on the touch sensing line.

FIGS. 21 to 24 are diagrams related to a local floating driving according to embodiments of the present disclosure.

Referring to FIGS. 21 to 24, it is illustrated a touch sensing area and a local floating area.

Touch sensing may proceed from the top to the bottom of the display panel 110.

Referring to FIG. 21, there is illustrated that the touch sensing area may progress from the top to the bottom of the display panel 110. In this case, the local floating area may be set as an area corresponding to the touch sensing area. That is, if the touch sensing area progresses from top to bottom, the local floating area may also progress from top to bottom.

FIG. 21 illustrates three examples of touch sensing in progress. Touch sensing may proceed from the top to the bottom of the display panel. Referring to FIG. 21, a touch sensing direction is shown on the left side of FIG. 21, and a local floating direction is shown on the right side of FIG. 21. The touch sensing area shown at the top of FIG. 21 is the area where touch sensing proceeds first, and the touch sensing area shown at the bottom of FIG. 21 is the area where touch sensing proceeds relatively lastest.

In the case that the touch sensing is performed in the touch sensing area shown at the top of FIG. 21, a local driving may be performed in the local floating area, which is an area corresponding to the touch sensing area.

If the touch sensing is performed in the touch sensing area shown in the middle of FIG. 21, a local driving may be performed in the local floating area, which is an area corresponding to the touch sensing area.

If the touch sensing is performed in the touch sensing area shown at the bottom of FIG. 21, a local driving may be performed in the local floating area, which is an area corresponding to the touch sensing area.

The size of the local floating area may be the same as the touch sensing area.

Alternatively, the size of the local floating area may be greater than a size of the touch sensing area.

Figure 22:
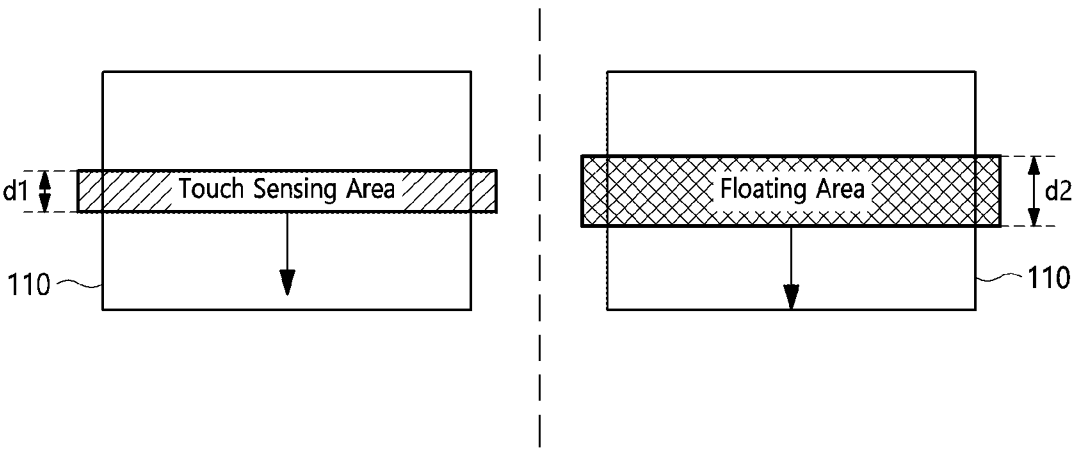

Referring to FIG. 22, it is illustrated that a vertical area d2 of the local floating area is larger than a vertical area d1 of the touch sensing area.

Figure 23:
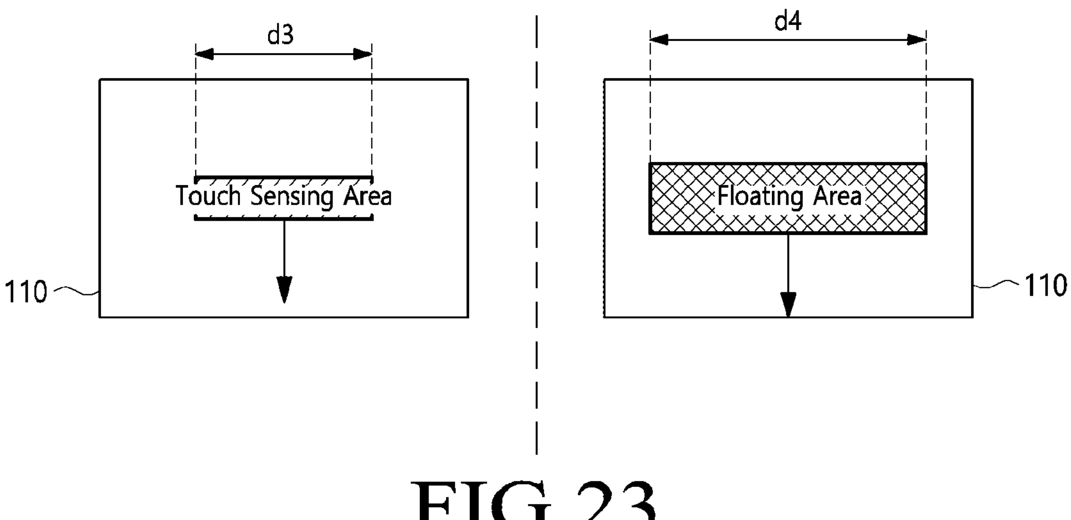

Referring to FIG. 23, it is illustrated that a horizontal area d4 of the local floating area is larger than a horizontal area d3 of the touch sensing area.

Referring to FIGS. 22 and 23, the vertical area of the local floating area may be determined by the voltage level state of the local control signal LCS. The horizontal area of the local floating area may be determined by the voltage level state of the driving control signal DES.

Figure 24:
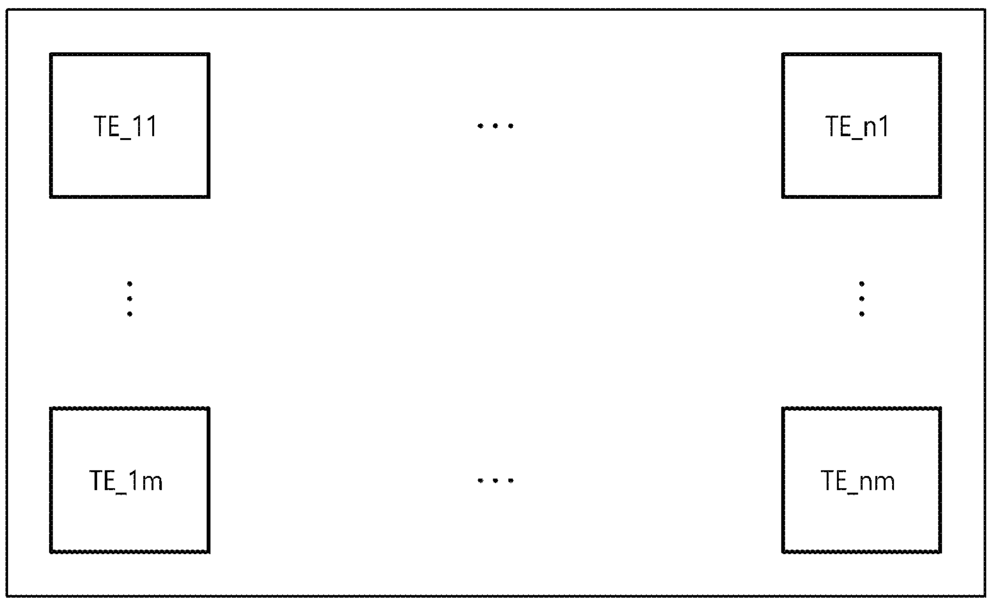

Referring to FIG. 24, the local floating driving may be performed through the control of the driving control signal DES supplied to the local control gate line GL_lcs.

Referring to FIG. 24, the local control gate line GL_lcs may be designed to be equal to the number of touch electrodes TE. In this case, each of the plurality of local control gate lines GL_lcs may be connected to one touch electrode TE among the plurality of touch electrodes TE.

For example, if there are n*m touch electrodes, there may also be n*m local control gate lines GL_lcs. The eleventh touch electrode TE_11 may be electrically connected to the eleventh local control gate line (not shown). The twenty-first touch electrode (not shown) may be electrically connected to the twenty-first local control gate line (not shown). The n1-th touch electrode TE_n1 may be electrically connected to the n1-th local control gate line (not shown). The 1m-th touch electrode TE_1m may be electrically connected to the 1m-th local control gate line (not shown). The 2m-th touch electrode (not shown) may be electrically connected to the 2m-th local control gate line (not shown). The nm-th touch electrode TE_nm may be electrically connected to the nm-th local control gate line (not shown). That is, the number of touch electrodes TE and the number of local control gate lines GL_les may be the same.

When the above-described local control gate line GL_lcs is disposed in the display panel shown in FIG. 3, the local control gate line GL_les may be disposed adjacent to the driving control gate line GL_des. Referring to FIGS. 12 and 15, there are illustrated the driving control gate line GL_des and the local control gate line GL_lcs. The local control gate line GL_lcs may be designed to correspond to the driving control gate line GL_des. That is, if one driving control gate line GL_des is additionally disposed, one local control gate line GL_lcs may also be additionally disposed. One driving control gate line GL_des and one local control gate line GL_lcs may be disposed adjacent to each other, but may be changed depending on the design.

Embodiments of the present disclosure described above are briefly described as follows.

A display device according to embodiments of the present disclosure may include a pixel area where a subpixel is disposed, and a touch area where a touch unit is disposed, wherein the subpixel includes a light emitting device, a driving transistor for driving the light emitting device, a scan transistor electrically connected to a gate node of the driving transistor, and a first control transistor electrically connected between the scan transistor and a data line.

The first control transistor may be supplied with a driving control signal through the gate node of the first control transistor.

A period during which the subpixel is driven may include an image display driving period for controlling the light emitting device, and a touch driving period for controlling the touch unit.

The touch driving period may include an initialization voltage supply period during which a line initialization voltage is supplied to the data line, and a floating period during which the first transistor is maintained in a turn-off state.

The subpixel further may include a second control transistor electrically connected between the scan transistor and the data line. The first control transistor may be supplied with a first driving control signal through a gate node of the first control transistor, and the second control transistor may be supplied with a second driving control signal different from the first driving control signal through a gate node of the second control transistor.

A voltage level of the second driving control signal may be different from a voltage level of the first driving control signal.

The subpixel may further include a second control transistor electrically connected between a gate node of the scan transistor and an image gate line, and a gate node of the first control transistor and a gate node of the second control transistor may be electrically connected to a driving control gate line.

The subpixel may further include a second control transistor electrically connected between a gate node of the scan transistor and an image gate line. The first control transistor may be supplied with a driving control signal through a gate node of the first control transistor, and the second control transistor may be supplied with a local control signal through a gate node of the second control transistor.

The display device according to embodiments of the present disclosure may further include an inverter circuit configured to receive a touch scan signal and then supply the local control signal to the gate node of the second control transistor based on the touch scan signal.

During a touch driving period in which a presence or absence of touch is determined through the touch unit, a period during which the local control signal is maintained as a first level signal may be longer than a period during which the driving control signal is maintained as a second level signal different from the first level signal.

The subpixel may further include a sensing transistor electrically connected to the driving transistor, and a second control transistor electrically connected between the sensing transistor and a reference voltage line.

The touch unit may include a touch sensor electrically connected to a touch signal supply line, and a touch transistor electrically connected between the touch sensor and a touch signal sensing line.

The touch sensor may be a transparent electrode.

The touch transistor may be supplied with a touch scan signal through a gate node of the touch transistor.

The touch signal supply line may supply a touch driving signal to the touch sensor, and the touch signal sensing line may be supplied with a signal for determining a presence or absence of touch.

The above description and the accompanying drawings provide an example of the technical idea of the present disclosure for illustrative purposes only. Various modifications, additions and substitutions to the described embodiments will be readily apparent to those skilled in the art without departing from the spirit and scope of the present disclosure. In addition, the disclosed embodiments are intended to illustrate the scope of the technical idea of the present disclosure. Thus, the scope of the present disclosure is not limited to the embodiments shown.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a pixel area where a subpixel is disposed; and
a touch area where a touch unit is disposed,
wherein the subpixel comprises,
a light emitting device,
a driving transistor for driving the light emitting device,
a scan transistor electrically connected to a gate node of the driving transistor, and
a first control transistor electrically connected between the scan transistor and a data line,
wherein a period during which the subpixel is driven comprises:
an image display driving period for controlling the light emitting device; and
a touch driving period for controlling the touch unit, and
wherein the touch driving period comprises:
an initialization voltage supply period during which a line initialization voltage is supplied to the data line; and
a floating period during which the first transistor is maintained in a turn-off state.

2. The display device of claim 1, wherein the first control transistor is connected to be supplied with a driving control signal through a gate node of the first control transistor.

3. The display device of claim 1, wherein the subpixel further includes a second control transistor electrically connected between the scan transistor and the data line,
wherein the first control transistor is connected to be supplied with a first driving control signal through a gate node of the first control transistor,
wherein the second control transistor is connected to be supplied with a second driving control signal different from the first driving control signal through a gate node of the second control transistor.

4. The display device of claim 3, wherein a voltage level of the second driving control signal is different from a voltage level of the first driving control signal.

5. A display device, comprising:
a pixel area where a subpixel is disposed; and
a touch area where a touch unit is disposed,
wherein the subpixel comprises,
a light emitting device,
a driving transistor for driving the light emitting device,
a scan transistor electrically connected to a gate node of the driving transistor, and
a first control transistor electrically connected between the scan transistor and a data line, wherein the subpixel further comprises:
a sensing transistor electrically connected to the driving transistor; and
a second control transistor electrically connected between the sensing transistor and a reference voltage line.

6. The display device of claim 5, wherein a period during which the subpixel is driven comprises:
an image display driving period for controlling the light emitting device; and
a touch driving period for controlling the touch unit.

7. The display device of claim 6, wherein the touch driving period comprises:
an initialization voltage supply period during which a line initialization voltage is supplied to the data line; and
a floating period during which the first transistor is maintained in a turn-off state.

8. The display device of claim 7, wherein the line initialization voltage is further supplied to the reference voltage line during the initialization voltage supply period.

9. The display device of claim 1, wherein the subpixel further includes a second control transistor electrically connected between a gate node of the scan transistor and an image gate line,
wherein a gate node of the first control transistor and a gate node of the second control transistor are electrically connected to a driving control gate line.

10. The display device of claim 1, wherein the subpixel further includes a second control transistor electrically connected between a gate node of the scan transistor and an image gate line,
wherein the first control transistor is connected to be supplied with a driving control signal through a gate node of the first control transistor,
wherein the second control transistor is connected to be supplied with a local control signal through a gate node of the second control transistor.

11. The display device of claim 10, further comprising an inverter circuit configured to receive a touch scan signal and then supply the local control signal to the gate node of the second control transistor based on the touch scan signal.

12. The display device of claim 10, wherein, during a touch driving period in which a presence or absence of touch is determined through the touch unit, a period during which the local control signal is maintained as a first level signal is longer than a period during which the driving control signal is maintained as a second level signal different from the first level signal.

13. A display device, comprising:

a pixel area where a subpixel is disposed; and a touch area where a touch unit is disposed, wherein the subpixel comprises, a light emitting device, a driving transistor for driving the light emitting device, a scan transistor electrically connected to a gate node of the driving transistor, and a first control transistor electrically connected between the scan transistor and a data line, wherein the touch unit comprises:

a touch sensor electrically connected to a touch signal supply line; and a touch transistor electrically connected between the touch sensor and a touch signal sensing line.

14. The display device of claim 13, wherein the touch sensor is a transparent electrode.

15. The display device of claim 13, wherein the touch transistor is connected to be supplied with a touch scan signal through a gate node of the touch transistor.

16. The display device of claim 13, wherein the touch signal supply line is connected to supply a touch driving signal to the touch sensor, wherein the touch signal sensing line is connected to be supplied with a signal for determining a presence or absence of touch.

17. The display device of claim 16, wherein the touch transistor is configured to be on such that the touch signal sensing line is electrically connected with the touch sensor.

* * * * *